(12) United States Patent
Ma et al.

(10) Patent No.: US 12,520,682 B2
(45) Date of Patent: Jan. 6, 2026

(54) DISPLAY PANEL AND DISPLAY APPARATUS

(71) Applicant: Wuhan Tianma Microelectronics Co., Ltd., Wuhan (CN)

(72) Inventors: Yangzhao Ma, Wuhan (CN); Hao Dai, Wuhan (CN)

(73) Assignee: WUHAN TIANMA MICROELECTRONICS CO., LTD., Wuhan (CN)

( * ) Notice: Subject to any disclaimer, the term of this patent is extended or adjusted under 35 U.S.C. 154(b) by 610 days.

(21) Appl. No.: 17/976,895

(22) Filed: Oct. 31, 2022

(65) Prior Publication Data
US 2024/0081107 A1    Mar. 7, 2024

(30) Foreign Application Priority Data

Sep. 6, 2022    (CN) .......................... 202211084315.X

(51) Int. Cl.
| | | |
|---|---|---|
| *H01L 27/32* | (2006.01) | |
| *H10K 59/131* | (2023.01) | |
| *H10K 59/35* | (2023.01) | |
| *H10K 59/65* | (2023.01) | |

(52) U.S. Cl.
CPC ......... *H10K 59/131* (2023.02); *H10K 59/353* (2023.02); *H10K 59/65* (2023.02)

(58) Field of Classification Search
CPC .... H10K 59/131; H10K 59/353; H10K 59/65; H10D 86/441; H10D 86/60; G09F 9/30
See application file for complete search history.

(56) References Cited

U.S. PATENT DOCUMENTS

2017/0031323 A1    2/2017    Kim et al.

FOREIGN PATENT DOCUMENTS

| CN | 106409867 A | 2/2017 |
|---|---|---|
| CN | 109791745 A | 5/2019 |
| CN | 110515247 A | 11/2019 |
| CN | 111668260 A | 9/2020 |
| CN | 112599580 A | 4/2021 |
| CN | 113410257 A | 9/2021 |

OTHER PUBLICATIONS

The First Office Action for CN Application No. 2022110843 15.X, dated Dec. 28, 2024, 11 pages.

*Primary Examiner* — Elmito Breval
(74) *Attorney, Agent, or Firm* — East IP P.C.

(57) ABSTRACT

The present application discloses a display panel and a display apparatus. The display panel includes: a functional device area; a display area surrounding the functional device area; a plurality of data lines arranged in a first direction and extending in a second direction, wherein the first direction and the second direction intersect with each other, the data lines comprise first-type data lines, and each first-type data line is divided into a first data segment and a second data segment by the functional device area; and data connection lines, wherein each data connection line is to electrically connect a first data segment and a corresponding second data segment, wherein at least one of the data connection lines is arranged in the display area.

30 Claims, 16 Drawing Sheets

DISPLAY PANEL AND DISPLAY APPARATUS

CROSS REFERENCE TO RELATED APPLICATION

This application claims priority to Chinese Patent Application No. 202211084315.X, filed on Sep. 6, 2022, which is hereby incorporated by reference in its entirety.

TECHNICAL FIELD

The present application relates to a field of display technology, and particularly to a display panel and a display apparatus.

BACKGROUND

With the development of display technology, a display panel has a higher and higher screen-to-body ratio, and a full-screen display has attracted widespread attention due to its narrow bezel or even bezel-less display effect. At present, the display apparatus such as a mobile phone and a tablet computer often needs to reserve space on its front for an electronic device such as a commonly used front camera, an infrared sensing device, a fingerprint identification device, an earpiece, or the like. For example, these photosensitive devices are arranged at the top position of the front of the display apparatus, and a cut out area is arranged at the corresponding position.

Since at least some of data lines divided by the cut out area need to be connected by connection lines respectively, a larger wiring space needs to be provided around the cut out area, which reduces the screen-to-body ratio of the display screen.

SUMMARY

Embodiments of the present application provide a display panel and a display apparatus.

In a first aspect, an embodiment of the present application provides a display panel, including: a functional device area; a display area surrounding the functional device area; a plurality of data lines arranged in a first direction and extending in a second direction, wherein the first direction and the second direction intersect with each other, the data lines comprise first-type data lines, and each first-type data line is divided into a first data segment and a second data segment by the functional device area; and data connection lines, wherein each data connection line is to electrically connect a first data segment and a corresponding second data segment, wherein at least one of the data connection lines is arranged in the display area.

Based on a same inventive concept, in a second aspect, an embodiment of the present application provides a display apparatus, including the display panel according to the embodiment of the first aspect.

BRIEF DESCRIPTION OF THE DRAWINGS

Other features, objects and advantages of the present application will become more apparent upon reading the following detailed description of non-limiting embodiments with reference to the accompanying drawings, wherein the same or similar reference numerals denote the same or similar features, and the figures are not drawn to actual scale.

DETAILED DESCRIPTION

Figure 1:
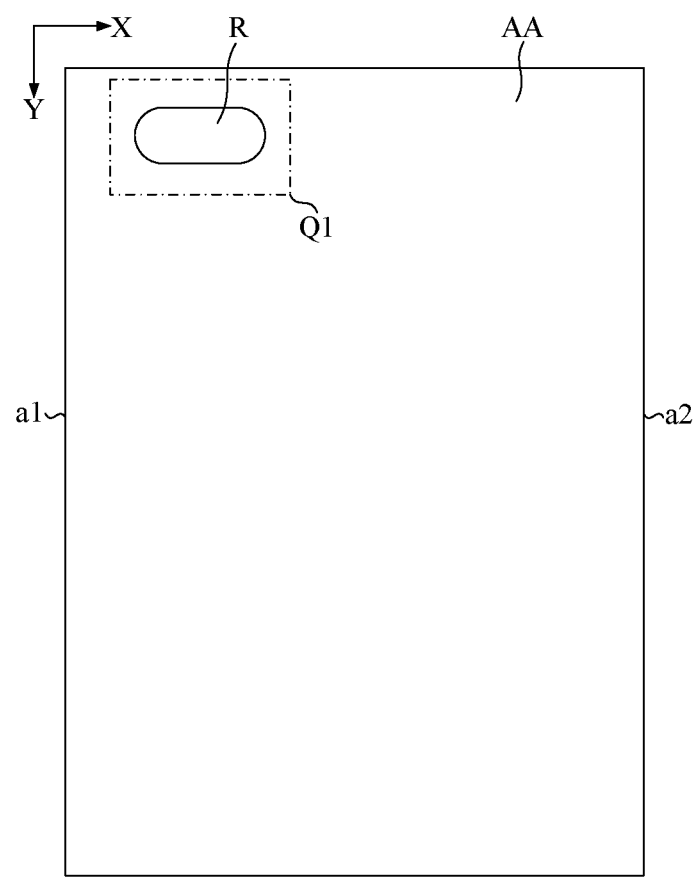
FIG. 1 shows a schematic top view of a display panel provided by an embodiment of the present application.

The features and exemplary embodiments of various aspects of the present application will be described in detail below. In order to make the purpose, technical solutions and advantages of the present application more clear, the present application will be further described in detail below with reference to the accompanying drawings and specific embodiments. It should be understood that the specific embodiments described herein are only configured to explain the present application, and are not configured to limit the present application. It will be apparent to those skilled in the art that the present application may be practiced without some of these specific details. The following description of the embodiments is merely to provide a better understanding of the present application by illustrating examples of the present application.

It should be noted that, relational terms such as first and second herein are used only to distinguish one entity or operation from another entity or operation, and do not necessarily require or imply that any such relationship or sequence actually exists among these entities or operations. In addition, the terms "include", "comprise" or any other variation thereof are intended to encompass non-exclusive inclusion, such that a process, method, article or device which includes a list of elements includes not only those elements, but also other elements which are not explicitly listed or elements inherent to such process, method, article or device. Without further limitation, an element defined by the phrase "include" does not preclude the presence of additional identical elements in the process, method, article, or device that includes the element.

It will be understood that, in describing a structure of a component, when a layer or area is referred to as being "on" or "over" another layer or area, it may refer to that the layer or area is directly on the another layer or area, or other layer or area is further included between the layer or area and the another layer or area. Further, if the component is turned over, the layer or area will be "below" or "beneath" the another layer or area.

It should be understood that the term "and/or" used in this document is only to describe an association relationship of associated objects, which indicates that there may be three kinds of relationships. For example, A and/or B may indicate three cases of A existing alone, A and B existing at the same time, and B existing alone. In addition, the character "/" herein generally indicates that related objects have an "or" relationship.

In the embodiments of the present application, the term "electrical connection" may refer to a direct electrical connection of two components, or may refer to an electrical connection between the two components via one or more other components.

It will be apparent to those skilled in the art that various modifications and variations may be made in this application without departing from the spirit or scope of the application. Accordingly, this application is intended to cover the modifications and variations of this application that fall within the scope of the corresponding claims (claimed technical solutions) and their equivalents. It should be noted that the implementations provided in the embodiments of the present application may be combined with one another without confliction.

The embodiments of the present application provide a display panel and a display apparatus, and the display panel and the display apparatus provided by the embodiments of the present application will be introduced below with reference to the accompanying drawings.

Figure 2:
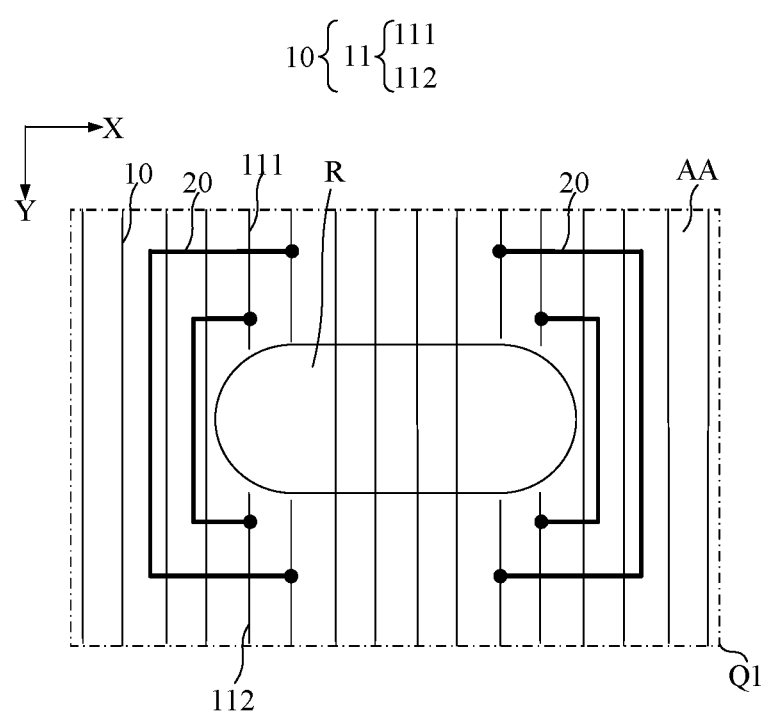
FIG. 2 shows an exemplary partial enlarged view of an area Q1 in FIG. 1.

FIG. 1 shows a schematic top view of a display panel provided by an embodiment of the present application. FIG. 2 shows an exemplary partial enlarged view of an area Q1 in FIG. 1. As shown in FIG. 1 and FIG. 2, the display panel 100 may include a functional device area R, a display area AA surrounding the functional device area R, and data lines 10 and data connection lines 20.

The functional device area R may be a non-display area or a transparent display area. An electronic device may be arranged in the functional device area R. The electronic device includes, but not limited to, a front camera, an infrared sensing device, a fingerprint identification device, an earpiece, or the like.

The shape of the functional device area R may be a racetrack shape, an ellipse, a circle, a rectangle, etc. The shape of the functional device area R is illustrated as a racetrack shape in the drawings of the present application, which is not intended to limit the present application.

In FIG. 1, the functional device area R is exemplarily arranged at the upper left corner, but this is not intended to limit a specific position of the functional device area R. The position of the functional device area R may be set based on actual requirements.

The data lines 10 are arranged in the display area AA. The data lines 10 extend in a second direction Y, and a plurality of data lines 10 are arranged in a first direction X. The first direction X and the second direction Y intersect with each other. As an example, the first direction X may be a row direction, and the second direction Y may be a column direction.

Since an electronic device(s) is to be placed in the functional device area R, at least the data lines corresponding to the position of the electronic device will be divided into two parts. Therefore, the data lines 10 may include first-type data lines 11, and each first-type data line is divided into a first data segment 111 and a second data segment 112 by the functional device area R. Here, the first-type data lines 11 may at least correspond to the position where the electronic device is located.

In the second direction Y, the first data segment 111 is located above the functional device area R, and the second data segment 112 is located below the functional device area R. In addition, some of the data lines 10 may not be divided by the functional device area R, and these data lines are continuous lines in the second direction Y. Some of these data lines that are continuous in the second direction Y may be arranged outside the functional device area R, and some of them may pass through the functional device area R.

Each data connection line 20 electrically connects a first data segment 111 and a corresponding second data segment 112. At least one of the data connection lines 20 is arranged in the display area AA. The data connection lines 20 may round around the functional device area R in the display area AA.

In the embodiments of the present application, since at least one of the data connection lines 20 is arranged in the display area AA, a number of lines in the functional device area R may be reduced. Therefore, an area of the functional device area R may be reduced. Under a condition that the functional device area R is a non-display area, an area of the non-display area is reduced, and thus an area of the display area is increased, which is beneficial to increase the screen-to-body ratio of the display panel. Under a condition that the functional device area R is a transparent display area, a transmittance of the functional device area R may be increased.

Figure 3:
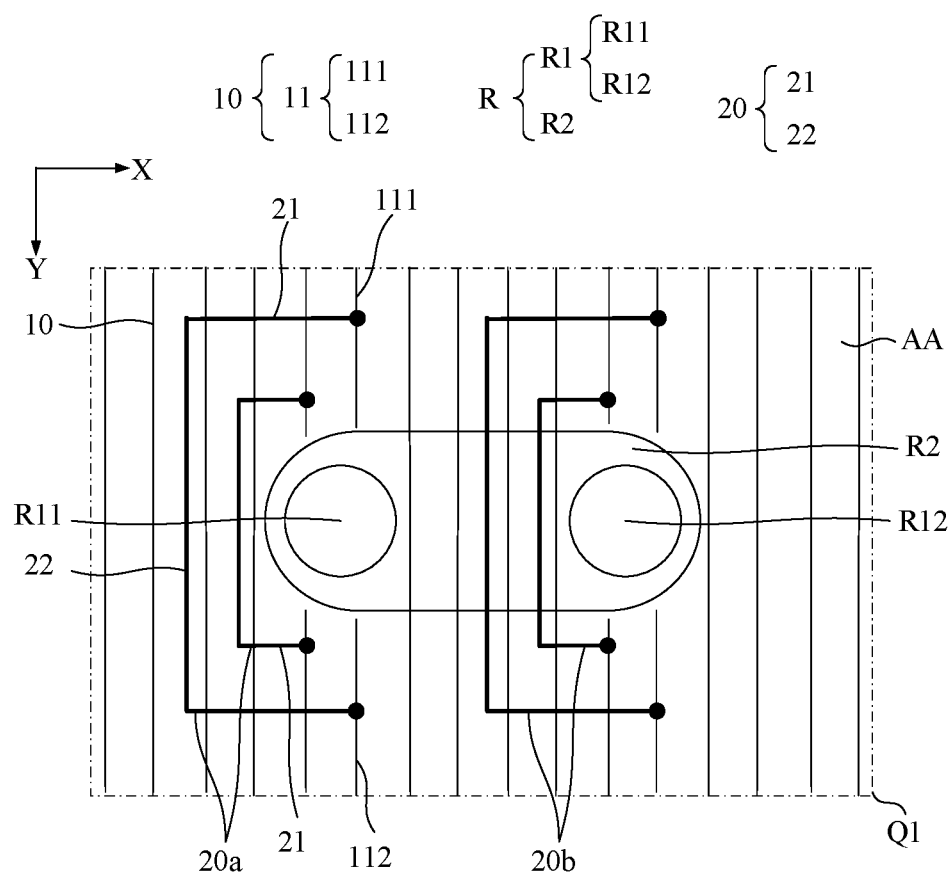
FIG. 3 shows another exemplary partial enlarged view of the area Q1 in FIG. 1.

FIG. 3 shows another exemplary partial enlarged view of the area Q1 in FIG. 1. As shown in FIG. 3, the functional device area R may include at least two transparent areas R1 arranged in the first direction X. In this embodiment and the following embodiments, the description is made by taking the functional device area being a non-display area as an example. The transparent area within the functional device area may be understood as a cut out area or a transmission area which may enable the transmission of light and/or sound, and through which the light and/or sound may be transmitted from the electronic device to the outside or from the outside to the electronic device. The electronic device may be arranged to be aligned to the transparent area. Although in FIG. 3 and some following figures, a number of the transparent areas is two, the present application is not limited thereto, and may include three or more transparent areas.

An area in the functional device area R which surrounds the transparent areas R1 may be referred to as a frame area R2, and through holes, blind holes or some light-emitting pixels may be arranged in the positions of the transparent areas R1.

The data connection lines 20 may include at least two sets of data connection lines which have a one-to-one correspondence with the at least two transparent areas R1. For ease of description, in the examples of FIG. 3, the number of the transparent areas is set to be two, the two transparent areas R1 may be respectively referred to as a first transparent area R11 and a second transparent area R12, the first transparent area R11 corresponds to a set a of data connection lines, and the second transparent area R12 corresponds to a set b of data connection lines. Each set of data connection lines may include a plurality of data connection lines. Each data connection line 20 of the set a of data connection lines is to connect a first data segment 111 and a corresponding second data segment 112 which are divided by the first transparent area R11. Each data connection line 20 of the set b of data connection lines is to connect a first data segment 111 and a corresponding second data segment 112 which are divided by the second transparent area R12.

In the first direction X, the sets of data connection lines round respective transparent areas at a same orientation of the respective transparent areas. For example, each set of data connection lines round its corresponding transparent area on left side of the transparent area, or each set of data connection lines round its corresponding transparent area on right side of the transparent area.

As an example, please refer to FIG. 1 and FIG. 3 in combination, in the first direction X, the display area AA may include a first edge a1 and a second edge a2 which are opposite to each other. Each set of data connection lines round its corresponding transparent area on a side of the transparent area close to the first edge a1, and any two of the sets of data connection lines are spaced apart by one or more transparent areas. For example, each data connection line of the set a of data connection lines rounds the first transparent area R11 on left side of the first transparent area R11, each data connection line of the set b of data connection lines 20 rounds the second transparent area R12 on left side of the second transparent area R12, and the set a of data connection lines and the set b of data connection lines are spaced apart by the first transparent area R11.

In an embodiment of the present application, the first transparent area R11 and its corresponding set 20a of data connection lines as a whole may be arranged symmetrically to the second transparent area R12 and its corresponding set 20b of data connection lines. Thus, an influence by the first transparent area R11 and its corresponding set 20a of data connection lines on a display effect of a surrounding display area thereof and an influence by the second transparent area R12 and its corresponding set 20b of data connection lines on a display effect of a surrounding display area thereof may tend to be symmetrical, which reduces a difference among the influences by the different transparent areas on the display effects of the surrounding display areas thereof, which may improve a display uniformity.

Although FIG. 1 and some of the following figures illustrate that the first edge a1 is a left edge and the second edge a2 is a right edge, in some examples, the first edge a1 may be the right edge and the second edge a2 may be the left edge.

Exemplarily, as shown in FIG. 1, the functional device area R may be close to one of the first edge a1 and the second edge a2. For example, under a condition that each set of data connection lines round a corresponding transparent area on a side of the transparent area close to the first edge a1, the functional device area R may be arranged close to the first edge a1.

Figure 4:
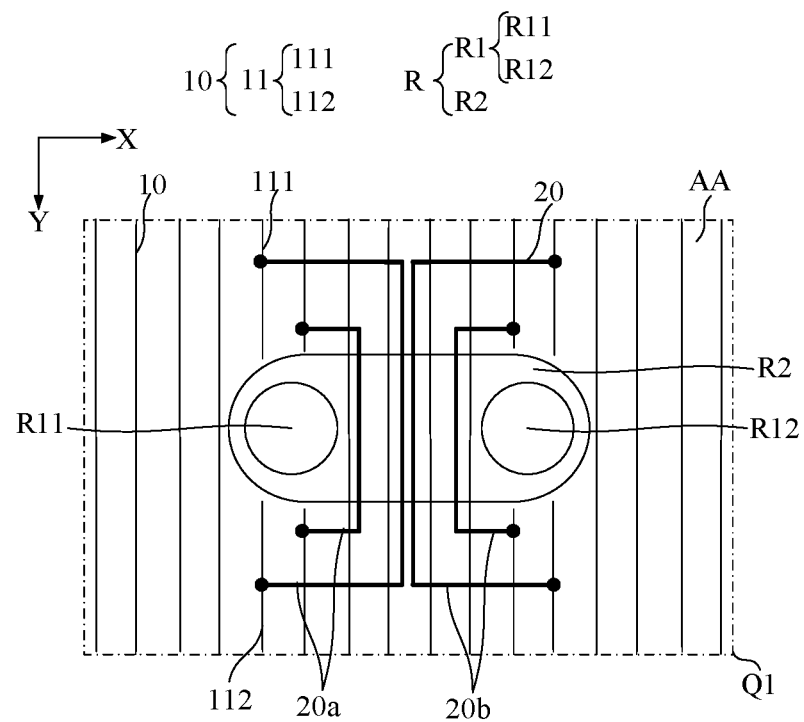
FIG. 4 shows another exemplary partial enlarged view of the area Q1 in FIG. 1.

FIG. 4 shows another exemplary partial enlarged view of the area Q1 in FIG. 1. As shown in FIG. 4, the functional device area R may include at least two transparent areas R1 arranged in the first direction X. An area in the functional device area R which surrounds the transparent areas R1 may be referred to as a frame area R2, and through holes may be arranged in the positions of the transparent areas R1.

The data connection lines 20 may include at least two sets of data connection lines which have a one-to-one correspondence with the at least two transparent areas R1. For ease of description, in the examples of FIG. 4, the number of the transparent areas is set to be two, the two transparent areas R1 may be respectively referred to as a first transparent area R11 and a second transparent area R12, the first transparent area R11 corresponds to a set a of data connection lines, and the second transparent area R12 corresponds to a set b of data connection lines. Each set of data connection lines may include a plurality of data connection lines 20. Each data connection line 20 of the set a of data connection lines is to connect a first data segment 111 and a corresponding second data segment 112 which are divided by the first transparent area R11. Each data connection line 20 of the set b of data connection lines is to connect a first data segment 111 and a corresponding second data segment 112 which are divided by the second transparent area R12. In the first direction X, the sets of data connection lines round respective transparent areas at different orientations of the respective transparent areas.

As an example, as shown in FIG. 4, the transparent area R1 includes a first transparent area R11 and an adjacent second transparent area R12. The set 20a of data connection lines, which correspond to the first transparent area R11, round the first transparent area R11 on right side of the first transparent area R11. The set 20b of data connection lines, which correspond to the second transparent area R12, round the second transparent area R12 on left side of the second transparent area R12.

In this way, the first transparent area R11 and its corresponding set 20a of data connection lines as a whole may also be arranged symmetrically to the second transparent area R12 and its corresponding set 20b of data connection lines. Thus, an influence by the first transparent area R11 and its corresponding set 20a of data connection lines on a display effect of a surrounding display area thereof and an influence by the second transparent area R12 and its corresponding set 20b of data connection lines on a display effect of a surrounding display area thereof may tend to be symmetrical, which reduces a difference among the influences by the different transparent areas on the display effects of the surrounding display areas thereof, which may improve the display uniformity.

Particularly, the two sets 20a and 20b of data connection lines, which correspond to the first transparent area Ru and the second transparent area R12 respectively, round the first transparent area Ru and the second transparent area R12 in an area between the first transparent area R11 and the second transparent area R12. In other words, each data connection line 20 of the two sets 20a and 20b of data connection lines may pass through an interior area between the first transparent area Ru and the second transparent area R12. In addition, the set 20a of data connection lines may be arranged close to the first transparent area R11, and the set 20b of data connection lines may be arranged close to the second transparent area R12. Therefore, it can be avoided that the data connection lines 20 of different sets of data connection lines intersect with one another. Thus, it can be avoided that the data connection lines 20 of different sets of data connection lines couple with one another.

Figure 5:
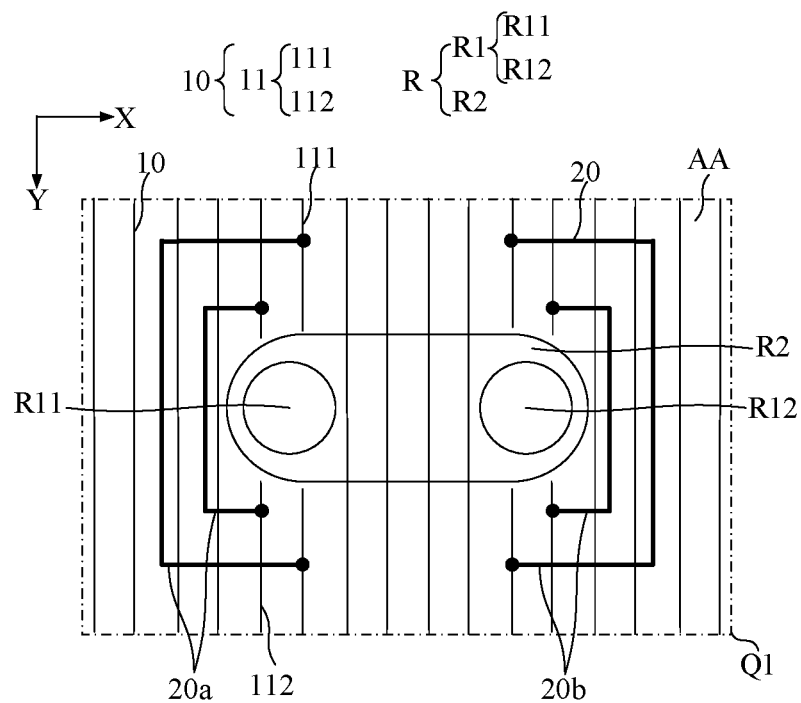
FIG. 5 shows another exemplary partial enlarged view of the area Q1 in FIG. 1.

As an example, as shown in FIG. 5, the transparent areas R1 includes a first transparent area R11 and an adjacent second transparent area R12, and in the first direction X, a set 20a of data connection lines corresponding to the first transparent area R11 round the first transparent area R11 on a side of the first transparent area R11 which is away from the second transparent area R12, and a set 20b of data connection lines corresponding to the second transparent area R12 round the second transparent area R12 on a side of the second transparent area R12 which is away from the first transparent area R11. In this way, each set of data connection lines round outside of the functional device area R, and each of the data connection lines 20 may be arranged in the display area AA, which may further reduce the number of lines in the functional device area R, and further increase the area of the display area, which is beneficial to improve the screen-to-body ratio of the display panel.

In some optional embodiments, as shown in any one of FIG. 2 to FIG. 5, a number of the data connection lines 20 of each set of data connection lines is equal. For example, the number of the data connection lines 20 of the set 20a of data connection lines which correspond to the first transparent area R11 may be equal to the number of the data connection lines 20 of the set 20b of data connection lines which correspond to the second light transmission area R12. It should be noted that the number of the data connection lines 20 of each set of data connection lines herein is only exemplary, and in order to illustrate different lines more clearly, the number of the data connection lines 20 of each set of data connection lines is only illustrated as two, but this is not intended to limit this application. It can be understood that the number of the data connection lines 20 of each set of data connection lines may be set to be larger based on actual situation.

In the embodiments of the present application, by setting the number of the data connection lines 20 of each set of data connection lines to be equal, it is convenient to arrange the data connection lines of the respective sets of the data connection lines in a same distribution order of arrangement, which is beneficial to realize the display uniformity.

As an example, the plurality of the transparent areas R1 have a same width in the first direction X. For example, all of the plurality of the transparent areas R1 are circles with a same radius. Obviously, the shape of the transparent area R1 may also be an ellipse, a rectangle, a square, or the like. The shapes of the transparent areas R1 shown in the drawings of the present application are only some examples, and are not intended to limit the present application.

Figure 6:
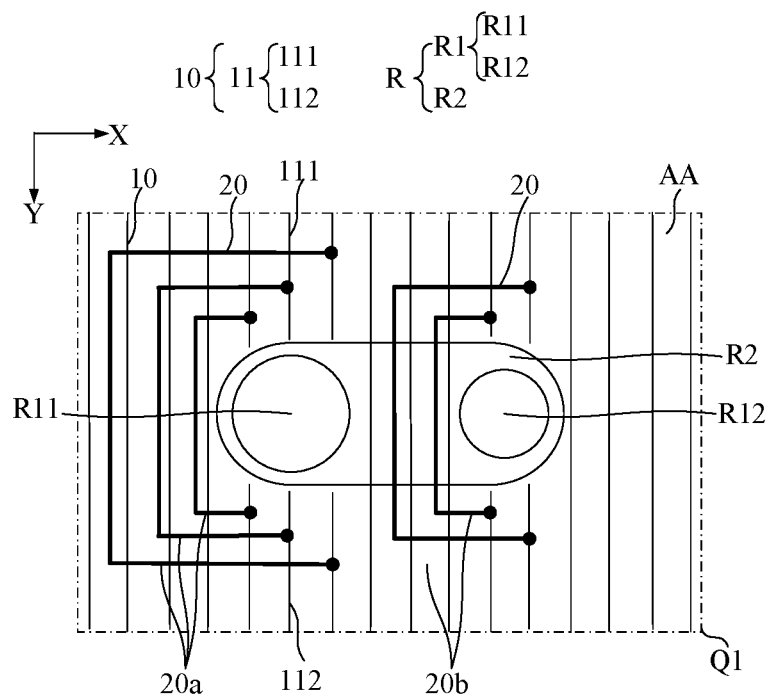
FIG. 6 shows another exemplary partial enlarged view of the area Q1 in FIG. 1.

As another example, as shown in FIG. 6, the functional device area R includes a first transparent area R11 and a second transparent area R12 which are arranged in the first direction X, and in the first direction X, the first transparent area Ru has a width larger than a width of the second transparent area R12. For example, the first transparent area Ru and the second transparent area R12 are both circles, and the first transparent area Ru has a radius larger than a radius of the second transparent area R12. The first transparent area R11 corresponds to a set 20a of data connection lines, and the second transparent area R12 corresponds to a set 20b of data connection lines. A number of the data connection lines 20 of the set 20a of data connection lines corresponding to the first transparent area R11 may be greater than a number of the data connection lines 20 of the set 20b of data connection lines corresponding to the second transparent area R12.

Since the first transparent area Ru has a relatively larger width in the first direction X, a number of the first-type data lines 11 divided by the first transparent area R11 is relatively greater. Thus, the number of the data connection lines 20 corresponding to the first transparent area R11 may set to be greater, so as to realize the connections for the first-type data lines 11 divided by the first transparent areas R11.

Under a condition that the numbers of the data connection lines corresponding to different transparent areas are different, and by taking that the data connection lines corresponding to a same transparent area are considered as one set of data connection lines as example again, a distribution of the sets of data connection lines illustrated in FIG. 6 may be similar as that shown in FIG. 4 and FIG. 5, except that the sets of data connection lines illustrated in FIG. 6 are arranged on the left side of the respective transparent areas.

In some optional embodiments, as shown in FIG. 3, the functional device area R may include at least two transparent areas R1 arranged in the first direction X, and data connection lines 20 may include at least two sets of data connection lines which have a one-to-one correspondence with the at least two transparent areas R1. The two transparent areas R1 may be respectively referred to as a first transparent area R11 and a second transparent area R12, the first transparent area R11 corresponds to a set a of data connection lines, and the second transparent area R12 corresponds to a set b of data connection lines. Each set of data connection lines may include a plurality of data connection lines. Each data connection line 20 of the set a of data connection lines is to connect a first data segment 111 and a corresponding second data segment 112 which are divided by the first transparent area R11. Each data connection line 20 of the set b of data connection lines is to connect a first data segment 111 and a corresponding second data segment 112 which are divided by the second transparent area R12.

Each data connection line 20 may include first connection segments 21 extending in the first direction X and a second connection segment 22 which extends in the second direction Y and is arranged between and connected to two first connection segments 21. One of the two first connection segments 21 may be connected to the first data segment 111, and another one of the two first connection segments 21 may be connected to the corresponding second data segment 112.

Exemplarily, the first connection segments 21 and the second connection segment 22 may be located in a same film layer, or may be located in different film layers. Under a condition of being located in different film layers, the first connection segments 21 and the second connection segment 22 may be connected through vias. The two first connection segments 21 of a same data connection line 20 may be located in a same film layer. Different second connection segments 22 may be located in a same film layer.

A plurality of second connection segments 22 of each set of data connection lines are arranged in the first direction X. For example, a plurality of second connection segments 22 of the set a of data connection lines are arranged in the first direction X, and a plurality of second connection segments 22 of the set b of data connection lines are arranged in the first direction X.

In each set of at least one of the sets of data connection lines, a $i^{th}$ second connection segment 22 is farther away from a transparent area R1 corresponding to the set of data connection lines than a $j^{th}$ second connection segment 22, the $i^{th}$ second connection segment 22 has a length of $L_i$, the $j^{th}$ second connection segment 22 has a length of $L_j$, and $L_i > L_j$. Since the outer $i^{th}$ second connection segment 22 has a longer length, in the second direction Y, the first connection segments 21 connected to the $i^{th}$ second connection segment 22 may be farther away from the corresponding transparent area R1 than the first connection segments 21 connected to the $j^{th}$ second connection segment 22. Therefore, it can be avoided that a data connection line 20 corresponding to the $i^{th}$ second connection segment 22 and a data connection line 20 corresponding to the $j^{th}$ second connection segment 22 intersect with each other, which reduces or even eliminates a coupling effect between the two data connection lines, and improves the display uniformity.

The $i^{th}$ second connection segment 22 and the $j^{th}$ second connection segment 22 may be adjacent. In each set of at least one of the sets of data connection lines, in a direction from the set of data connection lines to its corresponding transparent area, the respective second connection segment 22 may have a length shorter than a length of a previous second connection segment 22. In this case, any two of the data connection lines in the set of data connection lines may not intersect with each other.

Figure 7:
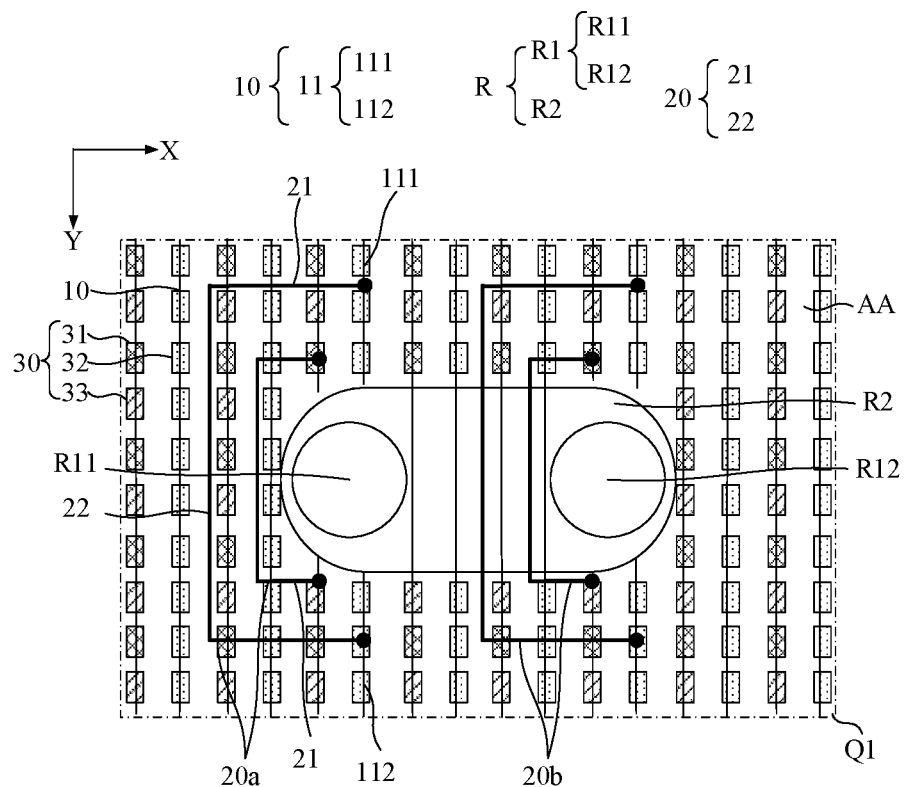
FIG. 7 shows another exemplary partial enlarged view of the area Q1 in FIG. 1.

As shown in FIG. 7, the display panel may include sub-pixels 30 arranged in an array. The sub-pixels 30 in a same column may be connected to a same data line 10. The data line 10 may be used for transmitting data signal from a driving chip to the sub-pixels 30 connected thereto, and the sub-pixels 30 may emit light with corresponding brightness based on the data signal received by the sub-pixels 30. It can be understood that each first-type data line 11 is divided into a first data segment 111 and a second data segment 112, and the first data segment 111 and the second data segment 112 are connected through a data connection line 20. For example, the driver chip may be located on a side of the second data segment 112 which is away from the functional device area R, and the data signal provided by the driver chip may reach the first data segment 111 through the second data segment 112 and the data connection line 20.

However, different lengths of the data connection lines 20 may result in inconsistent delay of the data signal. The longer the length of the data connection line 20 is, the more serious the delay of the data signal will be. When a voltage on the data line 10 connected to a data connection line 20 is switched, for example, when the voltage is switched to another voltage with a large difference value with respect to the voltage, especially when the switching is performed from a high level voltage to a low level voltage, a voltage with a higher value may be written into the sub-pixels due to the delay of the data signal, which causes a lower brightness.

In a data connection line 20, the second connection segment 22 may have a length longer than a length of the first connection segment 21. The lengths of the data connection lines 20 may mainly depend on the lengths of the respective second connection segments 22. The longer the length of the second connection segment 22 is, the longer the length of the corresponding data connection line 20 is.

In each set of at least one of the sets of data connection lines, under a condition that the $i^{th}$ second connection segment has a length longer than a length of the $j^{th}$ second connection segment, a data line 10 connected to the $i^{th}$ second connection segment 22 is to electrically connect with sub-pixels 30 of m1 kinds of colors, and a data line 10 connected to the $j^{th}$ second connection segment 22 is to electrically connect with sub-pixels 30 of m2 kinds of colors, and m1<m2.

The longer $i^{th}$ second connection segment 22 is to electrically connect with sub-pixels 30 of fewer kinds of colors, and thus a possibility of a switching of a voltage on a corresponding data line is lower, which may reduce the effect of delay caused by the longer length of the $i^{th}$ second connection segment 22.

As an example, m1=1, and m2=2. The longer $i^{th}$ second connection segment 22 is to electrically connect with sub-pixels 30 of one color, and the shorter $j^{th}$ second connection segment 22 is to electrically connect with sub-pixels 30 of two colors.

Figure 8:
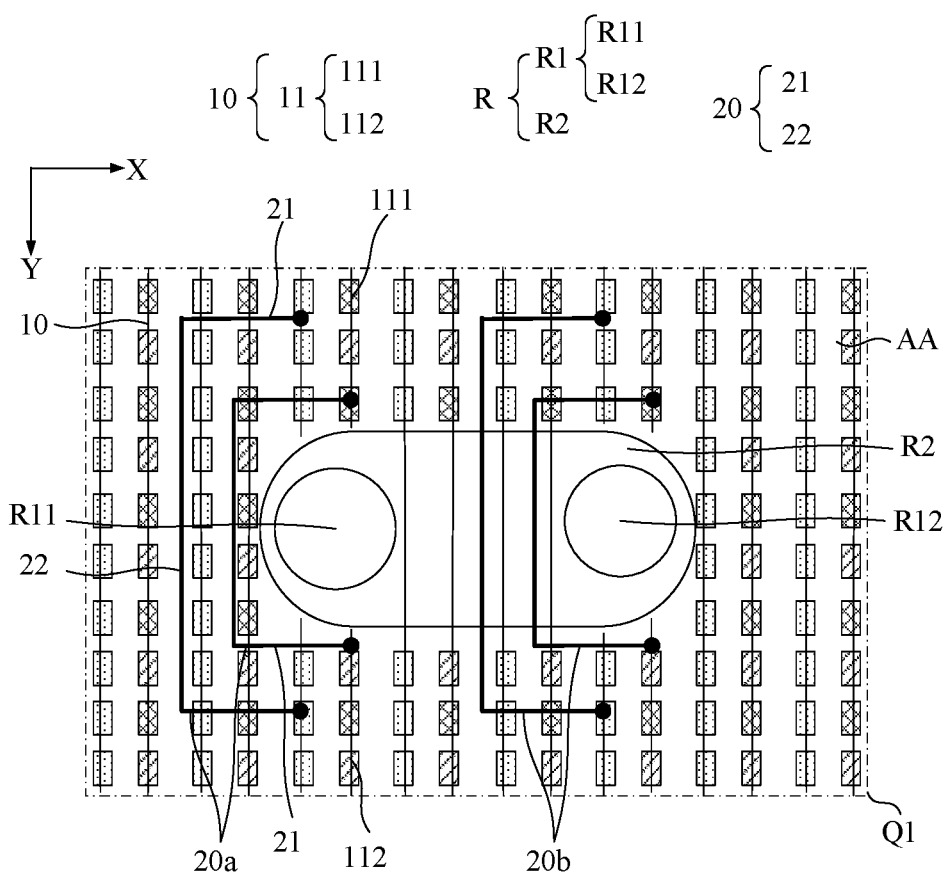
FIG. 8 shows another exemplary partial enlarged view of the area Q1 in FIG. 1.

As shown in FIG. 7 or FIG. 8, the sub-pixels 30 may include sub-pixels of three colors, which are first sub-pixels 31, second sub-pixels 32 and third sub-pixels 33, respectively. A same fill in the drawings may represent sub-pixels of a same color.

The first sub-pixels 31 may be sub-pixels emitting red light, the second sub-pixels 32 may be sub-pixels emitting green light, and the third sub-pixels 33 may be sub-pixels emitting blue light. The first sub-pixels 31 and the third sub-pixels 33 may be located in a same column, and the second sub-pixels 32 may be located in a separate column. The first sub-pixels 31 and the third sub-pixels 33 which are located in a same column may be connected to a same data line 10, and the second sub-pixels 32 located in a same column may be connected to a same data line 10.

Exemplarily, the data line 10 connected to the longer $i^{th}$ second connection segment 22 may be to electrically connect with sub-pixels emitting green light, and the data line 10 connected to the shorter $j^{th}$ second connection segment 22 may be to electrically connect with sub-pixels emitting red light and sub-pixels emitting blue light. Since the sub-pixels emitting red light and the sub-pixels emitting blue light are more sensitive to a delay of data voltage, the influence of the delay of the data voltage on the sub-pixels emitting red light and the sub-pixels emitting blue light may be reduced by electrically connecting the sub-pixels emitting red light and the sub-pixels emitting blue light to the shorter $j^{th}$ second connection segment 22. While the sub-pixels emitting green light are less sensitivity to the delay of the data voltage when there is no voltage switching. Therefore, the sub-pixels emitting green light are electrically connected to the longer $i^{th}$ second connection segment 22. In this way, a display uniformity among the sub-pixels of different colors may be improved.

In particular, as shown in FIG. 7 or FIG. 8, the longer $i^{th}$ second connection segment 22 may be electrically connected with the second sub-pixels 32, and the shorter $j^{th}$ second connection segment 22 may be electrically connected with the first sub-pixels 31 and the third sub-pixels 33.

In some optional embodiments, first connection segments 21 connected to the $i^{th}$ second connection segment 22 have a length of $H_i$, and first connection segments 21 connected to the $j^{th}$ second connection segment 22 have a length of $H_j$. As an example, as shown in FIG. 7 and FIG. 8, in each of at least one of the sets of data connection lines, $H_i \geq H_j$. Since Li>Lj, in this case, an overall length of the data connection line 20 to which the $i^{th}$ second connection segment 22 belongs is greater than an overall length of the data connection line 20 to which the $j^{th}$ second connection segment 22 belongs. For example, the $i^{th}$ second connection segment 22 and the $j^{th}$ second connection segment 22 may be adjacent, and in each of at least one of the sets of data connection lines, in a direction from the set of data connection lines to its corresponding transparent area, the respective data connection line 20 may have an overall length shorter than an overall length of a previous data connection line 20. In this case, signal delays due to the different lengths of the data connection lines 20 may also be changed gradually, which may avoid a sudden change among the signal delays caused by the different lengths of the data connection lines 20. Therefore, a sudden change on the display effect is avoided, and the display uniformity can be further improved.

In addition, in each set of data connection lines, under a condition that Hi=Hj, the differences in the overall length among the data connection lines 20 are only dependent on the differences in the length among the second connection segments 22. For example, the differences in the length among the second connection segments 22 may be minimized, to minimize the differences in the overall length among the data connection lines 20 in the set of data connection lines.

As an example, as shown in FIG. 7, in any set of the sets of data connection lines, Hi>Hj.

As another example, as shown in FIG. 8, in any set of the sets of data connection lines, Hi=Hj.

Figure 9:
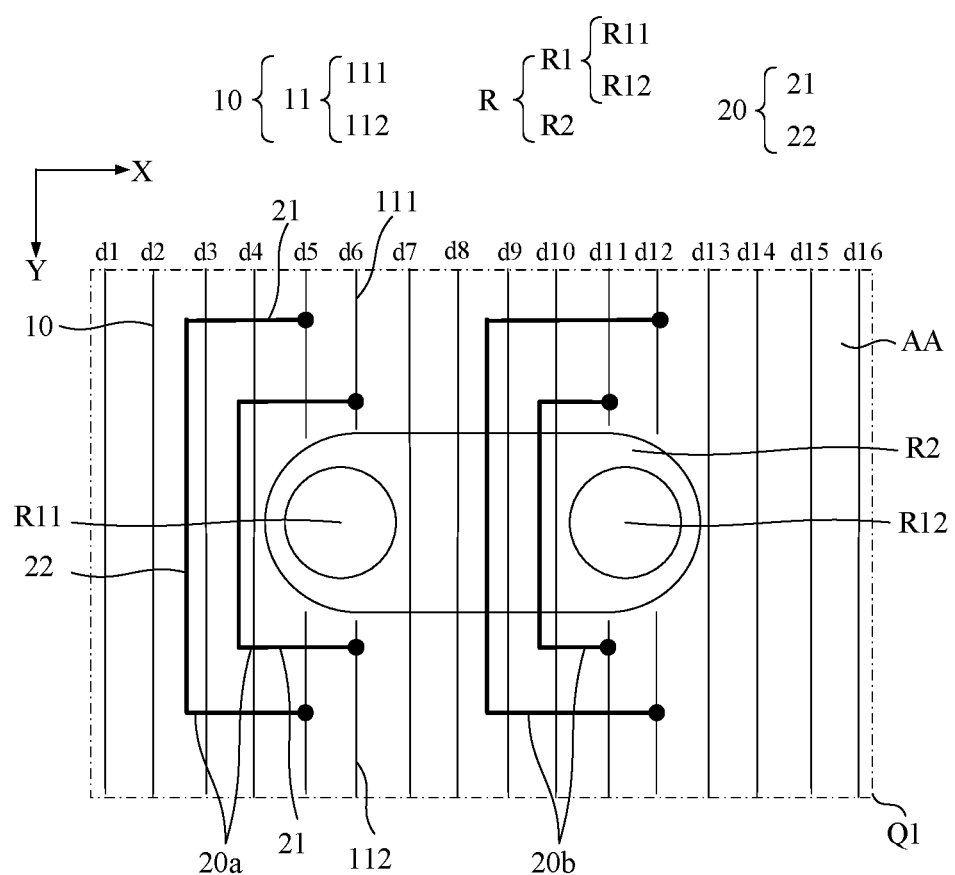
FIG. 9 shows another exemplary partial enlarged view of the area Q1 in FIG. 1.

As another example, as shown in FIG. 9, in at least one set of the sets of data connection lines, Hi>Hj; and in at least another one of the sets of data connection lines, Hi=Hj. For example, in the set 20a of data connection lines, Hi>Hj. In the set 20b of data connection lines, Hi=Hj.

Exemplarily, the two first connection segments 21 of a same data connection line 20 have a same length.

Figure 10:
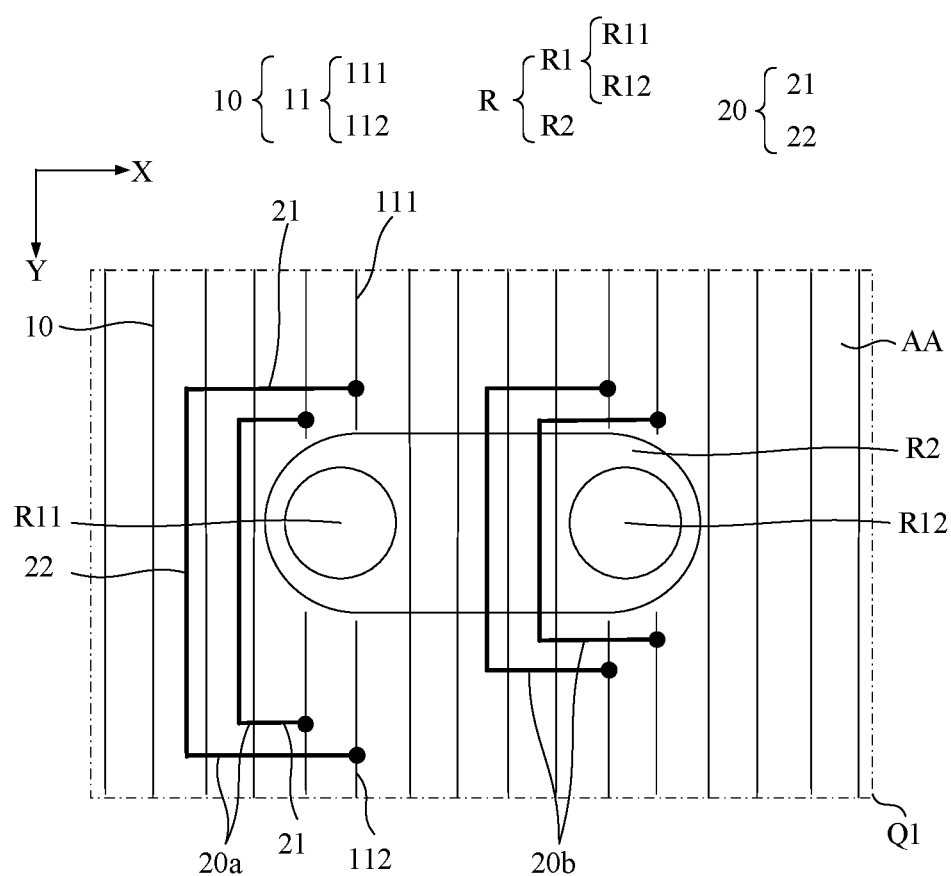
FIG. 10 shows another exemplary partial enlarged view of the area Q1 in FIG. 1.

In some optional embodiments, please refer to FIG. 1 and FIG. 10 in combination, the display area AA includes a first edge a1 and a second edge a2 which are opposite to each other in the first direction X, the transparent areas R1 are arranged to be close to the first edge a1, the transparent areas R1 include a first transparent area R11 and a second transparent area R12, and the first transparent area R11 is closer to the first edge a1 than the second transparent area R12.

A $i^{th}$ second connection segment 22 corresponding to the first transparent area R11 has a length of $L1_i$, a $j^{th}$ second connection segment 22 corresponding to the first transparent area R11 has a length of $L1_j$, a second connection segment 22 corresponding to the second transparent area R12 has a length of $L2_i$, and a $j^{th}$ second connection segment corresponding to the second transparent area R12 has a length of $L2_j$, wherein $L1_i>L2_i$, and $L1_j>L2_j$.

In this way, in a direction from left to right, the lengths of the respective second connection segments 22 corresponding to the first transparent area R11 are longer than the lengths of the respective second connection segments 22 corresponding to the second transparent area R12. The signal delays caused by the set 20a of data connection lines and the set 20b of data connection lines may be changed gradually, which may avoid a sudden change among the signal delays. Therefore, a sudden change on the display effect is avoided, and the display uniformity can be further improved.

Exemplarily, as shown in FIG. 10, the shortest second connection segment 22 of the set 20a of data connection lines is closest to the longest second connection segment 22 of the set 20b of data connection lines, and the $i^{th}$ second connection segment 22 and the $j^{th}$ second connection segment 22 in each set of data connection lines may be adjacent. In a direction from left to right, the respective second connection segment 22 may have a length shorter than a length of a previous second connection segment 22. Optionally, shortest second connection segment 22 of the set 20a of data connection lines may have a length longer than a length of the longest second connection segment 22 of the set 20b of data connection lines.

In the embodiments of the present application, a difference value between the lengths of any two adjacent second connection segments 22 of the set 20a of data connection lines is ΔL, and a difference value between the lengths of any two adjacent second connection segments 22 of the set 20b of data connection lines is ΔL.

Further, a difference value between the length of the shortest second connection segment 22 of the set 20a of data connection lines and the length of the longest second connection segment 22 of the set 20b of data connection lines may also be ΔL.

In some optional embodiments, please refer to FIG. 1 and FIG. 3 in combination, the display area AA includes the first edge a1 and the second edge a2 which are opposite to each other in the first direction X, the transparent areas R1 are arranged to be close to the first edge a1, the transparent areas R1 include the first transparent area R11 and the second transparent area R12, and the first transparent area R11 is closer to the first edge a1 than the second transparent area R12.

The $i^{th}$ second connection segment 22 corresponding to the first transparent area R11 has the length of $L1_i$, the $j^{th}$ second connection segment 22 corresponding to the first transparent area R11 has the length of $L1_j$, the $i^{th}$ second connection segment 22 corresponding to the second transparent area R12 has the length of $L2_i$, and the $j^{th}$ second connection segment corresponding to the second transparent area R12 has the length of $L2_j$, wherein $L1_i>L2_i$, and $L1_j>L2_j$.

In this way, the symmetry between the first transparent area R11 with its corresponding set 20a of data connection lines and the second transparent area R12 with its corresponding set 20b of data connection lines may be improved. Thus, the influence by the first transparent area R11 and its corresponding set 20a of data connection lines on the display effect of the surrounding display area thereof and the influence by the second transparent area R12 and its corresponding set 20b of data connection lines on the display effect of the surrounding display area thereof may tend to be more symmetrical, which further reduces the difference among the influences by the different transparent areas on the display effects of the surrounding display areas thereof, which further improves the display uniformity.

In the embodiments of the present application, in a direction from left to right, the respective second connection segment 22 may have a length shorter than a length of a previous second connection segment 22, in each set of data connection lines. The difference value between the lengths of any two adjacent second connection segments 22 of the set 20a of data connection lines is ΔL, and the difference value between the lengths of any two adjacent second connection segments 22 of the set 20b of data connection lines is ΔL. The length of the longest second connection segment 22 corresponding to the first transparent area Ru may be longer than the length of the longest second connection segment 22 corresponding to the second transparent area R12. The length of the longest second connection segment 22 of the set 20a of data connection lines is equal to the length of the longest second connection segment 22 of the set 20b of data connection lines, and the length of the shortest second connection segment 22 of the set 20a of data connection lines is equal to the length of the shortest second connection segment 22 of the set 20b of data connection lines.

Herein, the $i^{th}$ second connection segments 22 of different sets of data connection lines are second connection segments with a same relative position, and the $j^{th}$ second connection segments 22 of different sets of data connection lines are second connection segments with a same relative position. The relative position may be understood as a position of the second connection segment with respect to its corresponding transparent area. For ease of understanding, as an example, the $i^{th}$ second connection segment may be a second connection segment with a farthest distance from its corresponding transparent area in the first direction, and the $j^{th}$ second connection segment may be a second connection segment with a second farthest distance from its corresponding transparent area in the first direction.

Figure 11:
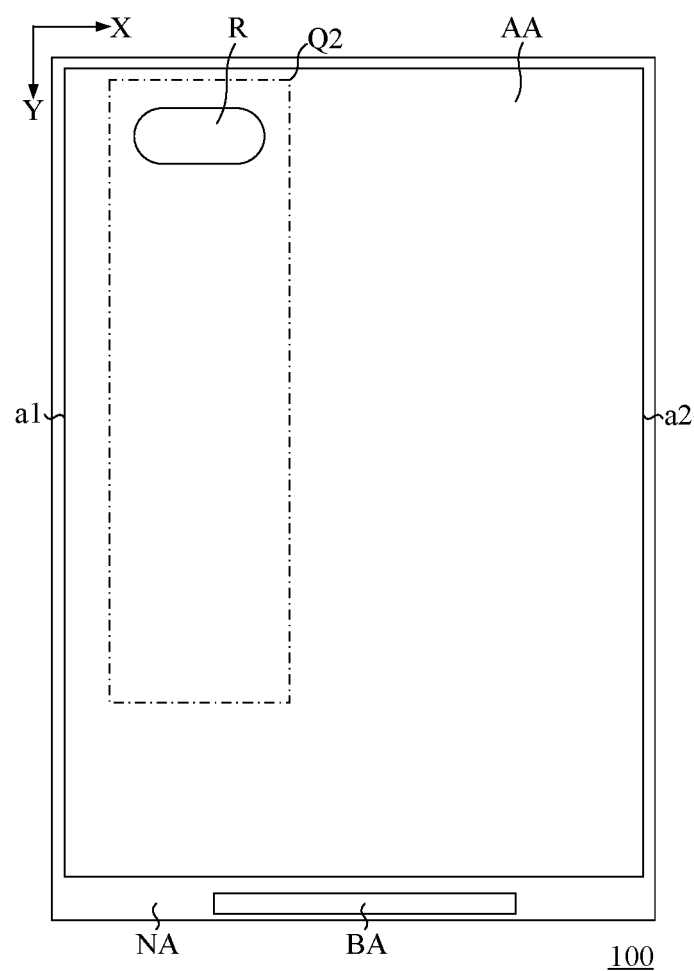
FIG. 11 shows another schematic top view of a display panel provided by an embodiment of the present application.
Figure 12:
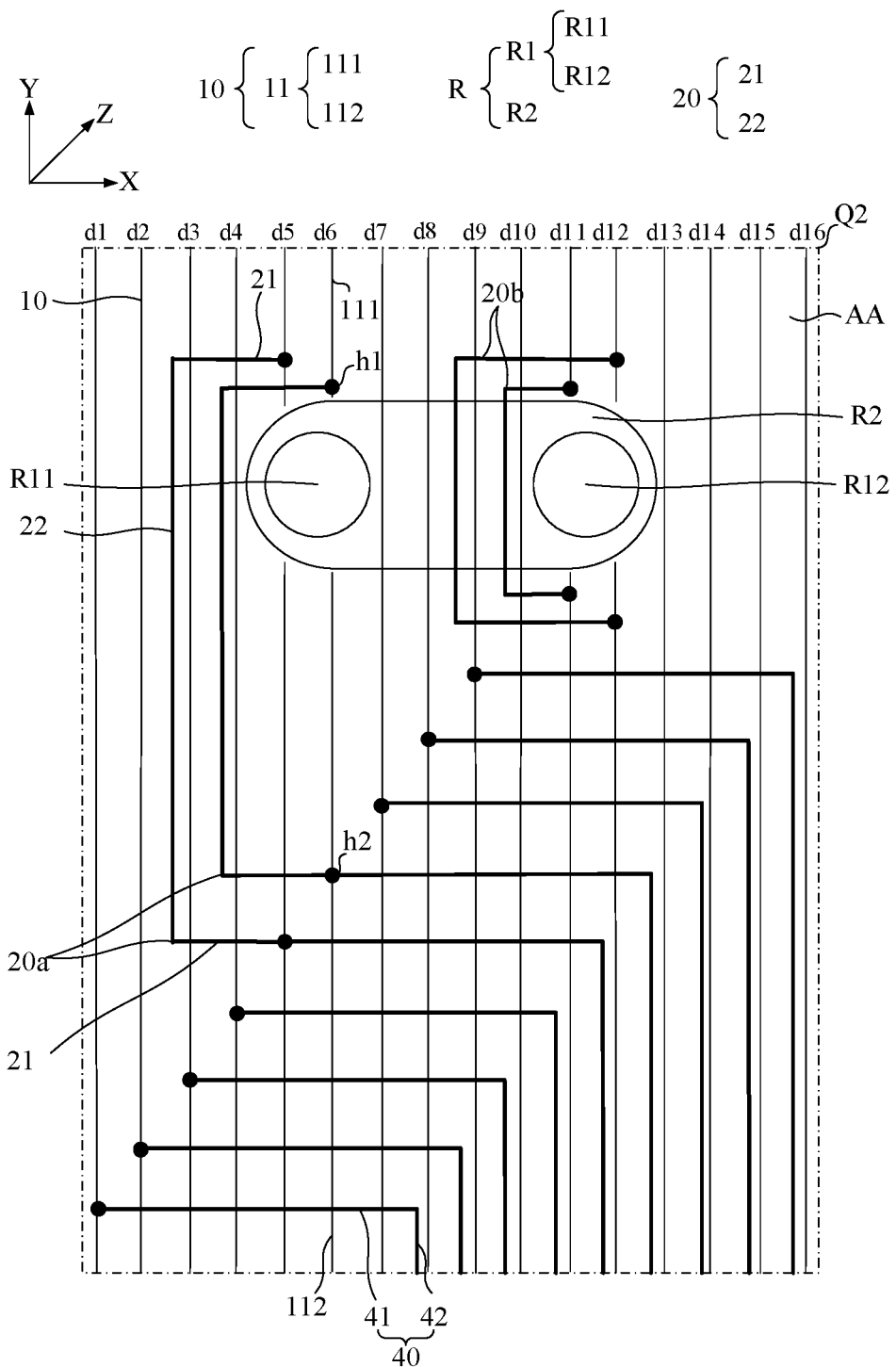
FIG. 12 shows an exemplary partial enlarged view of an area Q2 in FIG. 11.

In some optional embodiments, as shown with reference to FIGS. 11 and 12, the display panel 100 may further include a non-display area NA, and the non-display area NA includes a step area BA. The step area BA may include data signal terminals (not shown in FIG. 11), and the data signal terminals may be directly or indirectly bound and connected to the driver chip, and the driver chip may provide the data signal.

The display panel may further include auxiliary connection lines 40, the auxiliary connection lines 40 may be arranged in the display area AA, and at least one of the data lines 10 is connected to the step area BA of the display panel through the auxiliary connection line 40.

The data connection line 20 may be connected to the first data segment 111 through a first via h1, and the data connection line 20 may be connected to the second data segment 112 through a second via h2. In particular, one of the first connection segments 21 of the data connection line 20 is connected to the first data segment 111 through the first via h1, and the other one of first connection segments 21 of the data connection line 20 is connected to the second data segment 112 through the second via h2, and at least one of the second data segments 112 is electrically connected to the auxiliary connection line 40 through the second via h2.

For example, the auxiliary connection lines 40 need to be connected to the respective data lines 10 through vias.

In the embodiment of the present application, since the second data segment 112 is connected to the data connection line 20 and the auxiliary connection line 40 through a same second via h2, a number of required vias may be reduced. Since a coupling effect may also be occurred between the vias and other lines or devices, which affects the display uniformity, by reducing the number of the vias, the coupling effect may be reduced and the display effect may be improved. Optionally, the data connection lines 20 and the auxiliary connection lines 40 may be arranged in a same film layer, which may simplify manufacture process.

Exemplarily, each data connection line 20 corresponding to the first transparent area R11 may share the second via h2 with the auxiliary connection line 40, and the first-type data lines 11 divided by the second transparent area R12 may be connected to the step area BA without using the auxiliary connection lines 40.

Figure 13:
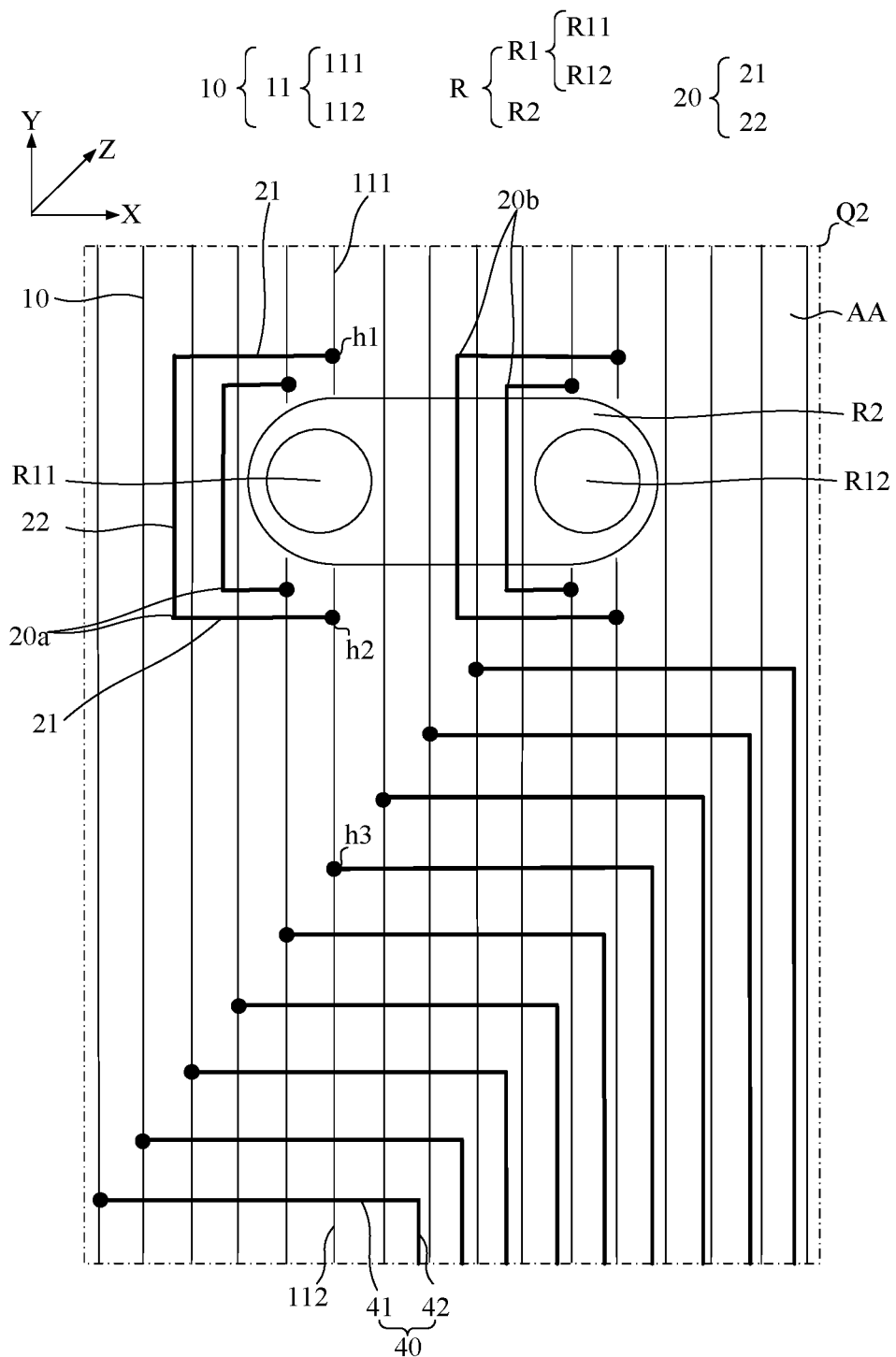
FIG. 13 shows another exemplary partial enlarged view of the area Q2 in FIG. 11.

In some optional embodiments, as shown in FIG. 13, at least one of the second data segments 112 may be connected to the auxiliary connection line 40 through a third via h3, and the second vias h2 are closer to the functional device area R than the third vias h3.

In the embodiment of the present application, since each second data segment 112 is connected to the data connection line 20 and the auxiliary connection line 40 through different vias, respectively, it is more beneficial to the consistency of distribution among the data connection lines corresponding to different transparent areas, which is beneficial to realize the display uniformity.

Exemplarily, each second via h2 for electrically connecting a data connection line 20 and a second data segment 112 may be close to the functional device area R, and a third via h3 for electrically connecting this second data segment 112 and an auxiliary connection line 40 may be away from the functional device area R.

In some optional embodiments, as shown in FIG. 13, each auxiliary connection line 40 may include a first auxiliary segment 41 extending in the first direction X and a second auxiliary segment 42 extending in the second direction Y, and all first auxiliary segments 41 have a same length.

Exemplarily, the distances between adjacent first auxiliary segments 41 in the second direction Y may be equal.

Exemplarily, the first auxiliary section 41 and the second auxiliary section 42 of a same auxiliary connection line 40 may be arranged in different film layers. In this case, the first auxiliary section 41 and the second auxiliary section 42 may be connected with each other through a via. Different first auxiliary sections 41 may be arranged in a same film layer, and different second auxiliary sections 42 may be arranged in a same film layer.

As an example, the first auxiliary segments 41 and the first connection segments 21 may be arranged in a same film layer. The second auxiliary sections 42 and the second connection segments 22 may be arranged in a same film layer.

In some optional embodiments, as shown in FIG. 12, the vias h2 for connecting respective auxiliary connection lines 40 and data lines 10 may be arranged in a third direction Z, or as shown in FIG. 13, the vias h3 for connecting respective auxiliary connection lines 40 and data lines 10 may be arranged in the third direction Z, and the third direction Z intersects with both the first direction X and the second direction Y. Exemplarily, the vias for connecting respective auxiliary connection lines 40 and data lines 10 may be arranged in a direction from the lower left corner of the display area to the upper right corner of the display area.

In some optional embodiments, referring to FIG. 11 and FIG. 12 in combination, the display area AA includes a first edge a1 and a second edge a2 which are opposite to each other in the first direction X, and in the first direction X, the farther away from the first edge a1 the second auxiliary segment is, the larger length the second auxiliary segment 42 has.

Exemplarily, the distances between adjacent first auxiliary segments 41 in the second direction Y may be equal. Optionally, the distances between adjacent second auxiliary segments 42 in the first direction X may be equal.

In some optional embodiments, as shown in FIG. 12, the functional device area R may include at least two transparent areas R1 arranged in the first direction X, and data connection lines 20 may include at least two sets of data connection lines which have a one-to-one correspondence with the at least two transparent areas R1. For ease of description, the two transparent areas R1 may be respectively referred to as a first transparent area R11 and a second transparent area R12, the first transparent area R11 corresponds to a set a of data connection lines, and the second transparent area R12 corresponds to a set b of data connection lines. Each set of data connection lines include a plurality of data connection lines. Each data connection line 20 of the set a of data connection lines is to connect a first data segment 111 and a corresponding second data segment 112 which are divided by the first transparent area R11. Each data connection line 20 of the set b of data connection lines is to connect a first data segment 111 and a corresponding second data segment 112 which are divided by the second transparent area R12.

Each data connection line 20 may include first connection segments 21 extending in the first direction X and a second connection segment 22 which extends in the second direction Y and is arranged between and connected to two first connection segments 21.

In each set of at least one of the sets of data connection lines, a $i^{th}$ second connection segment 22 has a length of $L_i$, a $j^{th}$ second connection segment 22 has a length of $L_j$, and $L_i > L_j$. A second auxiliary segment 42 connected to the $i^{th}$ second connection segment 22 has a length of Di, a second auxiliary segment 42 connected to the $j^{th}$ second connection segment 22 has a length of Dj, and Di<Dj. In this way, a total length of Li and Di may be approximately equal to a total length of Lj and Dj, that is, a sum of the lengths of the $i^{th}$ second connection segment 22 and the second auxiliary segment 42 connected thereto may be approximately equal to a sum of the lengths of the $j^{th}$ second connection segment 22 and the second auxiliary segment 42 connected thereto, which makes that the signal delay corresponding to the $i^{th}$ second connection segment 22 and the second auxiliary segment 42 connected thereto tends to be equal to the signal delay corresponding to the $j^{th}$ second connection segment 22 and the second auxiliary segment 42 connected thereto, thereby improving the display uniformity.

In order to better understand the connection relationship between the second connection segment 22 and the second auxiliary segment 42, as shown in FIG. 12, in the direction from left to right, the data lines d1-d16 may be arranged. Each of the data lines d5 and d6 may be divided into two sections by the first transparent area R11, and the two divided sections of each of the data lines d5 and d6 are connected by a corresponding data connection line of the set 20a of data connection lines. Each of the data lines d11 and d12 may be divided into two sections by the second transparent area R12, and the two divided sections of each of the data lines d11 and d12 are connected by a corresponding data connection line of the set 20b of data connection lines. The data lines d7, d8, d9 and d10 may pass through the functional device area R. Obviously, at least one of the data lines d7, d8, d9, and d10 may also be divided into two sections by the functional device area R, and then each two divided sections may be connected by a data connection line. The data lines d1, d2, d3, d4, d13, d14, d15 and d16 may be outside the functional device area R.

For example, the two divided sections of the data line d5 may be connected by the $i^{th}$ second connection segment 22 of the set 20a of data connection lines, and the second auxiliary section 42 connected with the data line d5 is connected with the $i^{th}$ second connection segment 22 of the set 20a of data connection lines. The two divided sections of the data line d6 may be connected by the $j^{th}$ second connection segment 22 of the set 20b of data connection lines, and the second auxiliary section 42 connected with the data line d6 is connected with the $j^{th}$ second connection segment 22 of the set 20b of data connection lines.

In some optional embodiments, as shown in FIG. 12 or FIG. 13, the second auxiliary segments 42 and the data lines 10 may be alternately arranged in the first direction X. Since there may be a coupling effect among the second auxiliary segments 42 and the data lines 10, by arranging the second auxiliary segment 42 and the data line 10 alternately, the coupling effect among the second auxiliary segments 42 and the data lines 10 may be distributed, and even be distributed evenly, which improves the display uniformity.

Exemplarily, at least one data line 10 may be arranged between two adjacent second auxiliary terminals 42. The number of data lines 10 arranged between any two adjacent second auxiliary terminals 42 may be equal.

As an example, in the present application, the second connection segments and the data lines 10 may be alternately arranged in the first direction X. At least one data line 10 may be arranged between two adjacent second auxiliary terminals 42. In a same set of data connection lines, the number of data lines 10 arranged between any two adjacent second auxiliary terminals 42 may be equal.

Figure 14:
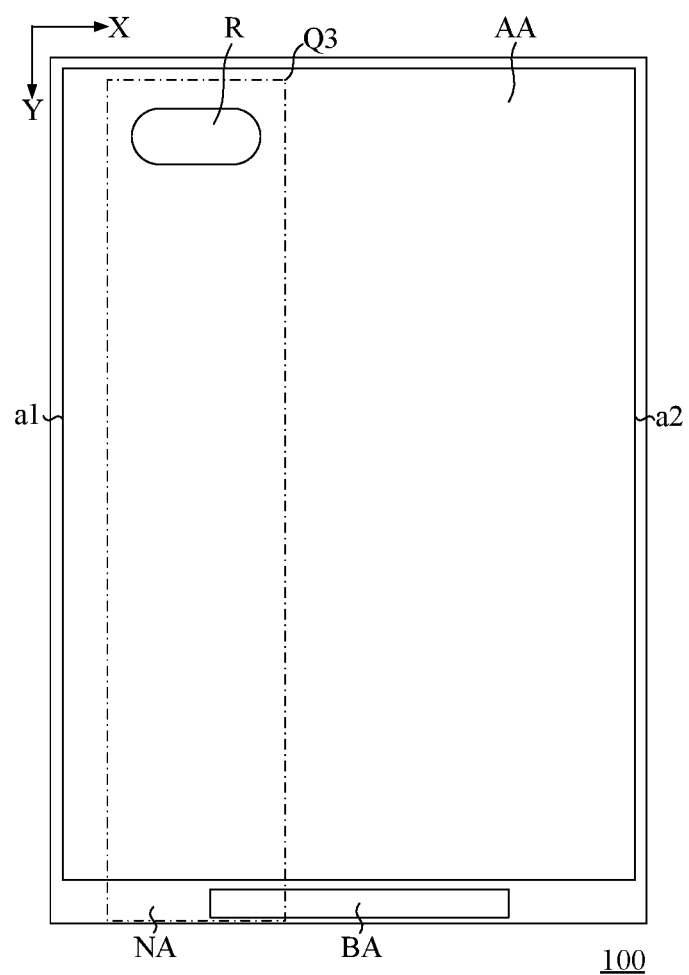
FIG. 14 shows another schematic top view of a display panel provided by an embodiment of the present application.
Figure 15:
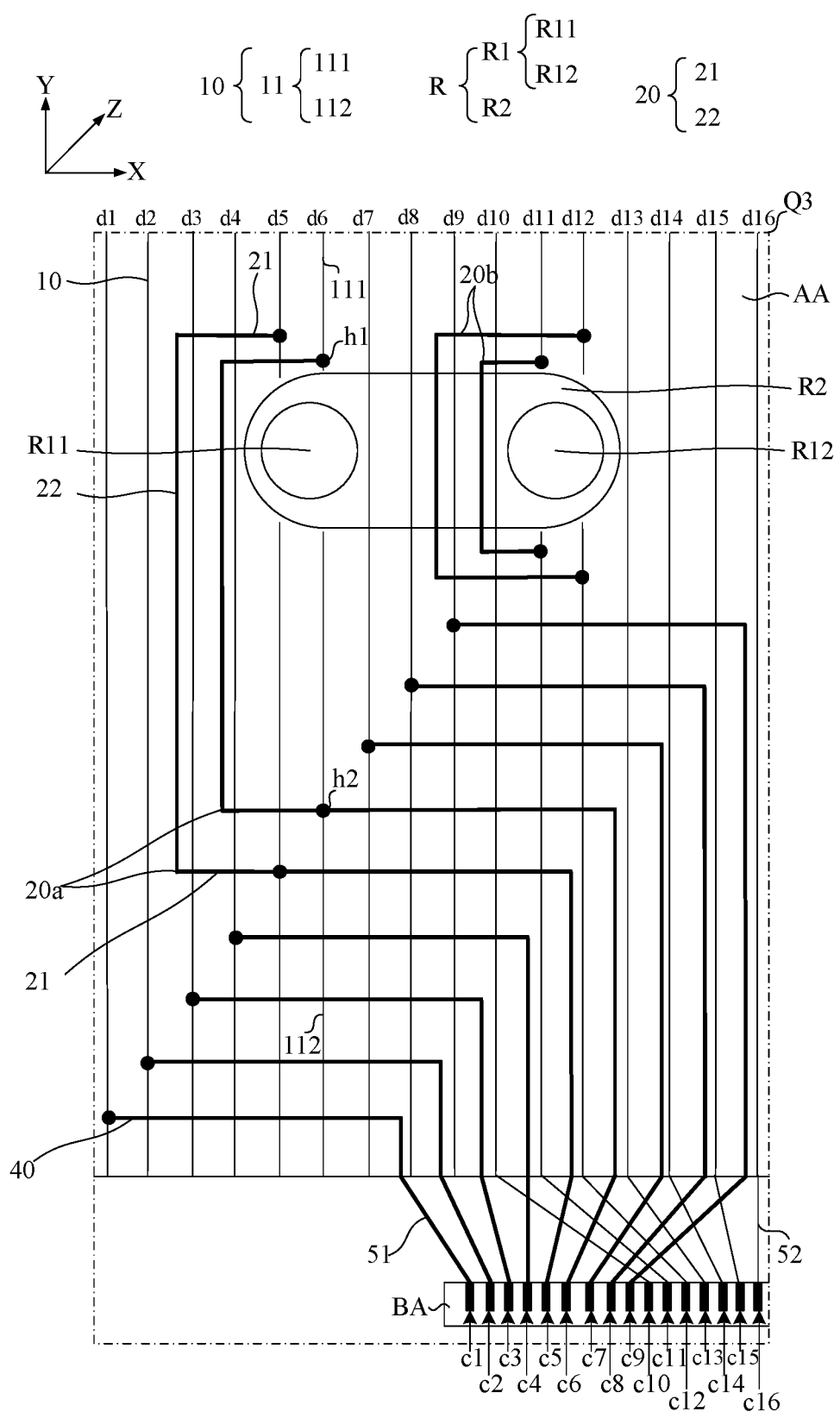
FIG. 15 shows an exemplary partial enlarged view of an area Q3 in FIG. 14.
Figure 16:
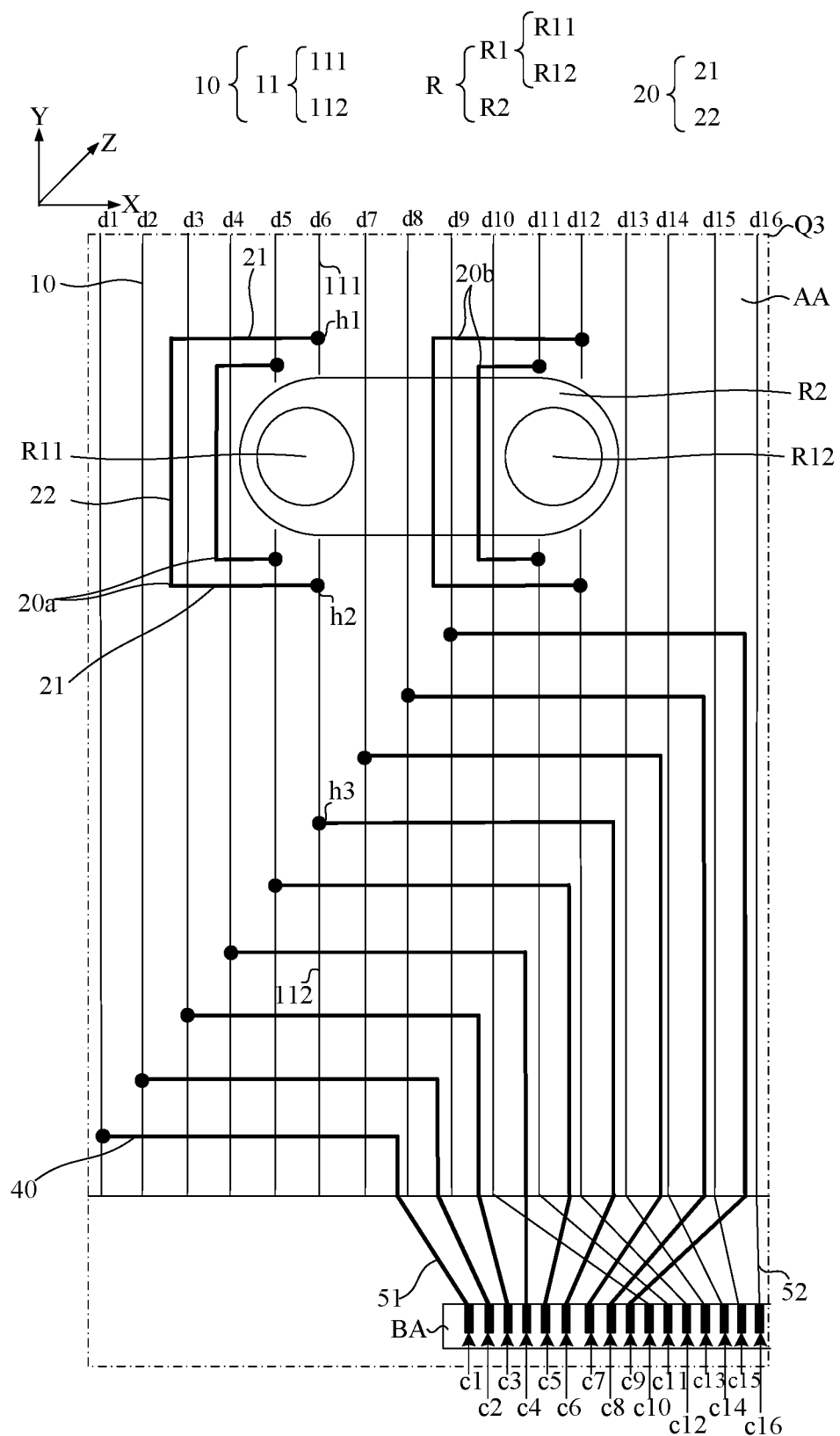
FIG. 16 shows another exemplary partial enlarged view of the area Q3 in FIG. 14.

In some optional embodiments, referring to FIG. 14, FIG. 15 and FIG. 16, first fan-out lines 51 and second fan-out lines 52 may be arranged between the step area BA of the display panel and the display area AA. At least one of the data lines 10 may be connected to a first fan-out line 51 through an auxiliary connection line 40 arranged in the display area AA, and at least another one of the data lines 10 may be connected to a second fan-out line 52. An orthographic projection of least one of the first fan-out lines 51 on a light-emitting surface of the display panel intersects with an orthographic projection of at least one of the second fan-out lines 52 on the light-emitting surface of the display panel. If there is not the intersecting of the first fan-out lines 51 and the second fan-out lines 52, the arrangement order of the data lines 10 is likely to be different from the arrangement order of the data signal terminals connected with the data lines, which increases the difficulty for outputting data signal by the driver chip. On the other hand, under a condition that there is the intersecting of the first fan-out lines 51 and the second fan-out lines 52, it is easy to realize the arrangement order of the data lines 10 to be the same as the arrangement order of the data signal terminals connected with the data lines, so as to avoid increasing difficulty for outputting data signal by the driver chip.

In order to better understand that the arrangement order of the data lines 10 is the same as the arrangement order of the data signal terminals connected with the data lines, as shown in FIG. 15 and FIG. 16, it is exemplarily shown that the data lines 10 include data lines d1-d16 arranged in sequence from left to right, the data signal terminals include data signal terminals c1-c16 arranged in sequence from left to right. Under a condition that the first fan-out lines 51 and the second fan-out lines 52 are arranged to be intersected with one another, the data line d1 may be electrically connected to the data signal terminal c1, the data line d2 may be electrically connected to the data signal terminal c2, the data line d3 may be electrically connected to the data signal terminal c3, . . . , and the data line d16 may be electrically connected to the data signal terminal c16, and thus the arrangement order of the data lines 10 being the same as the arrangement order of the data signal terminals connected with the data lines is realized.

Figure 17:
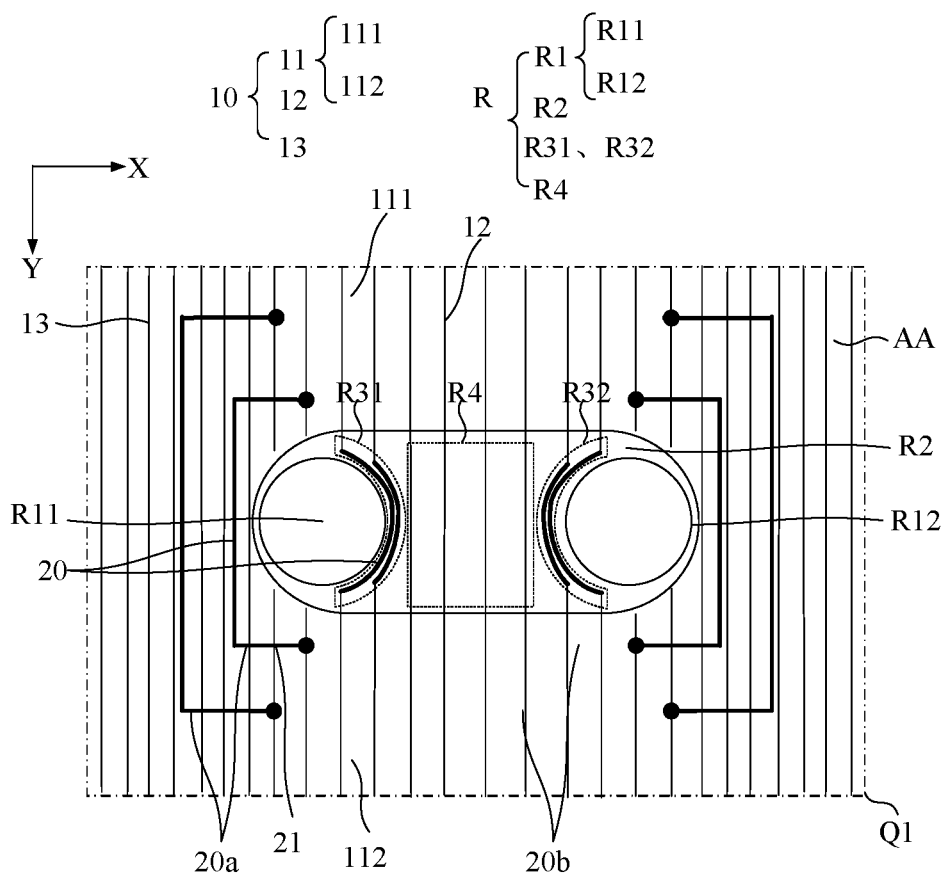
FIG. 17 shows another exemplary partial enlarged view of the area Q1 in FIG. 1.

In some optional embodiments, as shown in FIG. 17, the functional device area R may include at least two transparent areas R1 arranged in the first direction X, a first winding area R31 and a second winding area R32 are arranged between two adjacent transparent areas R1. The first winding area R31 is arranged around one of the two transparent areas R1, and the second winding area R32 is arranged around the other of the two transparent areas R1. Taking the two adjacent transparent areas R1 being a first adjacent transparent R11 and a second adjacent transparent R12 as an example, the first winding area R31 is arranged around the first adjacent transparent R11, and the second winding area R32 is arranged around the second adjacent transparent R12. n1 data connection lines 20 are arranged in the first winding area R31, n2 data connection lines 20 are arranged in the second winding area R32, and n1 and n2 are integers greater than or equal to 1.

In the embodiments of the present application, since the first winding area R31 and the second winding area R32 are arranged between adjacent transparent areas, the first winding area R31 and the second winding area R32 are arranged with the data connection lines 20, it can be avoid that all the data connection lines 20 are arranged in the display area around the functional device area R. Thus, it can be avoid that the lines in an area of the display area around the functional device area R are relatively intensive, which reduces a line-intensive difference among the area of the display area around the functional device area R and other areas of the display area at other positions. Thereby, the display uniformity is improved.

Exemplarily, at least one of the plurality of data connection lines 20 corresponding to at least one of the transparent areas R1 may be arranged in the display area, and at least another one of the plurality of the data connection lines 20 may be arranged in its corresponding winding area. For example, when a transparent area R1 corresponds to an even number of data connection lines 20, the numbers data connection lines 20 of the even-numbered data connection lines 20 corresponding to the transparent area R1 which are arranged in the display area and in the wiring area respectively may be equal.

In some optional embodiments, n1=n2. In this way, the data connection lines 20 may be evenly distributed, which is beneficial to improve the display uniformity.

In some optional embodiments, as shown in FIG. 17, a wiring area R4 is arranged between the first winding area R31 and the second winding area R32, and the data lines 10 may further include a second-type data line 12, and the second-type data line 12 passes through the wiring area R4.

As an example, each driving circuit of the display panel may be arranged outside the wiring area R4. In other words, no driving circuit may be arranged in the wiring area R4, so that no array film layer may be arranged in the wiring area R4, thereby reducing the interference of the driving circuit to the electronic device arranged in the transparent area. Here, the wiring area R4 may not be provided with any array film layer, which may be understood as that a component such as a transistor or a capacitor may not be provided in the wiring area R4, and the wiring area R4 may include an inorganic layer and/or an organic layer.

As shown in FIG. 17, the data lines 10 may further include third-type data lines 13 which are not divided by the functional device area R. For example, a pixel that may normally emit light is called as a real pixel, and a number of real pixels electrically connected to a third-type data line 13 is larger than a number of real pixels electrically connected to a second-type data line 12, resulting in a load difference between the second-type data line 12 and the third-type data line 13.

As another example, a dummy pixel(s) (not shown) may be arranged in the wiring area R4. The dummy pixel may include a pixel circuit and a light-emitting device, but the light-emitting device cannot emit light normally. The dummy pixel in the wiring area R4 may be electrically connected to the second-type data line 12, so that the load difference between the second-type data lines 12 and the third-type data lines 13 may be reduced, and the display uniformity may be improved.

Exemplarily, a total number of real pixels and dummy pixels electrically connected to a second-type of data line 12 may be equal to a total number of real pixels electrically connected to a third type of data lines 13.

Figure 18:
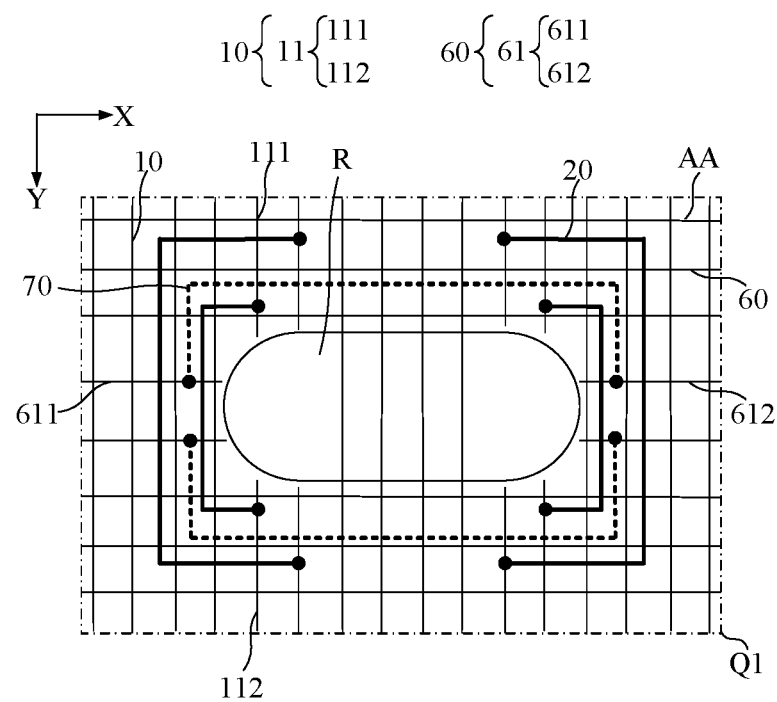
FIG. 18 shows another exemplary partial enlarged view of the area Q1 in FIG. 1.

In some optional embodiments, as shown in FIG. 18, the display panel 100 may further include signal lines 60 and signal connection lines 70. The signal lines 60 extend in the first direction X, and a plurality of signal lines 60 may be arranged in the second direction Y The signal line 60 may include first-type signal lines 61, each first-type signal line 61 includes a first signal segment 611 and a second signal segment 612 divided by the functional device area R. Each signal connection line 70 is arranged between and connected to a first signal segment 611 and a corresponding second signal segment 612, and at least one of the signal connection line 70 is arranged in the display area AA.

In addition, some of the signal lines 60 may not be divided by the functional device area R, and these signal lines 60 are continuous lines in the first direction X. All of these signal lines that are continuous in the first direction X may be arranged outside the functional device area R.

In the embodiments of the present application, since at least one of the signal connection lines 70 are arranged in the display area AA, the number of lines in the functional device area R may be reduced, thereby reducing the area of the functional device area R, that is, reducing the area of the non-display area. Thus, the area of the display area is increased, which is beneficial to increase the screen-to-body ratio of the display panel.

In some optional embodiments, the signal lines 60 include at least one of a scan line, a light-emitting control line, and an initialization signal line. The scan line may be used for providing scan signals to the pixel circuits of the sub-pixels, so as to control the turn-on or turn-off of transistors in the pixel circuits. The signal transmitted on the light-emitting control line may control the sub-pixels to enter into or terminate a light-emitting phase. The initialization signal line may be used for transmitting initialization signal, the initialization signal may be used for initializing the anodes of light-emitting elements in the sub-pixels, and/or the initialization signals may be used for initializing the gates of drive transistors in the sub-pixels.

Exemplarily, the display panel provided by the present application may be an organic light-emitting diode (OLED) display panel. Those skilled in the art should understand that, in other implementation manners of the present application, the display panel may also be a micro light emitting diode (Micro LED) display panel, a quantum dot display panel, and the like.

Figure 19:
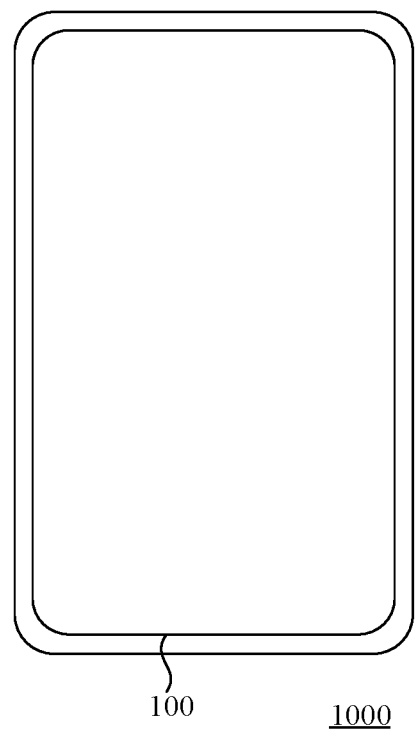
FIG. 19 shows a schematic structure diagram of a display apparatus provided by an embodiment of the present application.

Based on the same inventive concept, the present application further provides a display apparatus including the display panel provided by the present application. Please refer to FIG. 19, which is a schematic structure diagram of a display apparatus provided by an embodiment of the present application. The display apparatus 1000 provided in FIG. 19 includes the display panel 100 provided by any of the above-mentioned embodiments of the present application. The embodiment of FIG. 19 only takes a mobile phone as an example to describe the display apparatus 1000. It may be understood that the display apparatus provided by the embodiments of the present application may be a wearable product, a computer, a TV, a vehicle-mounted display apparatus, and other devices with a display function, which is not specifically limited in this application. The display apparatus provided by the embodiments of the present application has the beneficial effects of the display panels provided by the embodiments of the present application. For details, reference may be made to the specific descriptions of the display panels in the above-mentioned embodiments, which will not be repeated in this embodiment.

In accordance with the embodiments of the present application as described above, these embodiments do not exhaustively describe all the details, nor do they limit the application to only the specific embodiments described. Obviously, many modifications and variations are possible in light of the above description. These embodiments selected and described in the description are used to better explain the principles and practical applications of the present application, so that those skilled in the art may make good use of the present application and make modifications based on the present application. This application is to be limited only by the claims along with their scopes and equivalents.

What is claimed is:

1. A display panel, comprising:
   a functional device area;
   a display area surrounding the functional device area;
   a plurality of data lines arranged in a first direction and extending in a second direction, wherein the first direction and the second direction intersect with each other, the data lines comprise first-type data lines, and each first-type data line is divided into a first data segment and a second data segment by the functional device area; and
   data connection lines, wherein each data connection line is to electrically connect a first data segment and a corresponding second data segment,
   wherein at least one of the data connection lines is arranged in the display area;
   wherein the functional device area comprises at least two transparent areas arranged in the first direction, the data connection lines comprise at least two sets of data connection lines which have a one-to-one correspondence with the at least two transparent areas, and each data connection line of each set of data connection lines is to connect a first data segment and a corresponding second data segment which are divided by a corresponding transparent area,
   wherein each data connection line comprises first connection segments extending in the first direction and a second connection segment which extends in the second direction and is arranged between and connected to two first connection segments, and
   wherein in each set of at least one of the sets of data connection lines, a plurality of second connection segments are arranged in the first direction, a $i^{th}$ second connection segment is farther away from a transparent area corresponding to the set of data connection lines than a $j^{th}$ second connection segment, the $i^{th}$ second connection segment has a length of $L_i$, the $j^{th}$ second connection segment has a length of $L_j$, and $L_i > L_j$.

2. The display panel according to claim 1, wherein the functional device area comprises at least two transparent areas arranged in the first direction, the data connection lines comprise at least two sets of data connection lines which have a one-to-one correspondence with the at least two transparent areas, and each data connection line of each set of data connection lines is to connect a first data segment and a corresponding second data segment which are divided by a corresponding transparent area, and
   wherein in the first direction, the sets of data connection lines round respective transparent areas at a same orientation of the respective transparent areas.

3. The display panel according to claim 2, wherein the display area comprises a first edge and a second edge which are opposite to each other in the first direction, and each set of data connection lines round a corresponding transparent area on a side of the transparent area close to the first edge, and any two of the sets of data connection lines are spaced apart by one or more transparent areas.

4. The display panel according to claim 1, wherein the functional device area comprises at least two transparent areas arranged in the first direction, the data connection lines comprise at least two sets of data connection lines which have a one-to-one correspondence with the at least two transparent areas, and each data connection line of each set of data connection lines is to connect a first data segment and a corresponding second data segment which are divided by a corresponding transparent area, and
   wherein in the first direction, the sets of data connection lines round respective transparent areas at different orientations of the respective transparent areas.

5. The display panel according to claim 4, wherein the transparent areas comprises a first transparent area and an adjacent second transparent area, and two sets of data connection lines, which correspond to the first transparent area and the second transparent area respectively, round the first transparent area and the second transparent area in an area between the first transparent area and the second transparent area.

6. The display panel according to claim 4, wherein the transparent areas comprises a first transparent area and an adjacent second transparent area, and in the first direction, a set of data connection lines corresponding to the first transparent area round the first transparent area on a side of the first transparent area which is away from the second transparent area, and a set of data connection lines corresponding to the second transparent area round the second transparent area on a side of the second transparent area which is away from the first transparent area.

7. The display panel according to claim 1, wherein the functional device area comprises at least two transparent areas arranged in the first direction, the data connection lines comprise at least two sets of data connection lines which have a one-to-one correspondence with the at least two transparent areas, and each data connection line of each set of data connection lines is to connect a first data segment and a corresponding second data segment which are divided by a corresponding transparent area, wherein a number of the data connection lines of each set of data connection lines is equal.

8. The display panel according to claim 1, wherein a data line connected to the $i^{th}$ second connection segment is to electrically connect with sub-pixels of m1 kinds of colors, and a data line connected to the $j^{th}$ second connection segment is to electrically connect with sub-pixels of m2 kinds of colors, and m1<m2.

9. The display panel according to claim 8, wherein m1=1 and m2=2.

10. The display panel according to claim 8, wherein the data line connected to the $i^{th}$ second connection segment is to electrically connect with sub-pixels emitting green light, and the data line connected to the $j^{th}$ second connection segment is to electrically connect with sub-pixels emitting red light and sub-pixels emitting blue light.

11. The display panel according to claim 1, wherein first connection segments connected to the $i^{th}$ second connection segment have a length of $H_i$, and first connection segments connected to the $j^{th}$ second connection segment have a length of $H_j$, and
   wherein in each of at least one of the sets of data connection lines, $H_i > H_j$.

12. The display panel according to claim 1, wherein the display area comprises a first edge and a second edge which are opposite to each other in the first direction, the transparent areas are arranged to be close to the first edge, the transparent areas comprise a first transparent area and a second transparent area, and the first transparent area is closer to the first edge than the second transparent area,
   wherein a $i^{th}$ second connection segment corresponding to the first transparent area has a length of $L1_i$, a $j^{th}$ second connection segment corresponding to the first transparent area has a length of $L1_j$, a $i^{th}$ second connection segment corresponding to the second transparent area has a length of $L2_i$, a $j^{th}$ second connection segment corresponding to the second transparent area has a length of $L2_j$, and wherein $L1_i > L2_i$, and $L1_j > L2_j$.

13. The display panel according to claim 1, wherein the display area comprises a first edge and a second edge which are opposite to each other in the first direction, the transparent areas are arranged to be close to the first edge, the transparent areas comprises a first transparent area and a second transparent area, and the first transparent area is closer to the first edge than the second transparent area, wherein a $i^{th}$ second connection segment corresponding to the first transparent area has a length of $L1_i$, a $(i+1)^{th}$ second connection segment corresponding to the first transparent area has a length of $L1_{i+1}$, a $i^{th}$ second connection segment corresponding to the second transparent area has a length of $L2_i$, and a $(i+1)^{th}$ second connection segment corresponding to the second transparent area has a length of $L2_i+1$, and wherein $L1_i = L2_i$, and $L1_{i+1} = L2_{i+1}$.

14. The display panel according to claim 1, wherein the display panel further comprises:

auxiliary connection lines arranged in the display area, at least one of the data lines being connected to a step area of the display panel through an auxiliary connection line, wherein a data connection line is connected to a first data segment through a first via and connected to a second data segment through a second via, and at least one of second data segments is electrically connected to an auxiliary connection line through a second via.

15. The display panel according to claim 14, wherein at least one of second data segments is connected to an auxiliary connection line through a third via, and the second via is closer to the functional device area than the third via.

16. The display panel according to claim 1, wherein the display panel further comprises:

auxiliary connection lines arranged in the display area, at least one of the data lines being connected to a step area of the display panel through an auxiliary connection line, wherein each auxiliary connection line comprises a first auxiliary segment extending in the first direction and a second auxiliary segment extending in the second direction, and at least two of first auxiliary segments have a same length.

17. The display panel according to claim 16, wherein vias for connecting respective auxiliary connection lines and data lines are arranged in a third direction, and the third direction intersects with the first direction and the second direction.

18. The display panel according to claim 16, wherein the display area comprises a first edge and a second edge which are opposite to each other in the first direction, and in the first direction, the farther away from the first edge the second auxiliary segment is, the larger length the second auxiliary segment has.

19. The display panel according to claim 16, wherein the functional device area comprises at least two transparent areas arranged in the first direction, the data connection lines comprise at least two sets of data connection lines which have a one-to-one correspondence with the at least two transparent areas, and each data connection line of each set of data connection lines is to connect a first data segment and a corresponding second data segment which are divided by a corresponding transparent area, wherein each data connection line comprises first connection segments extending in the first direction and a second connection segment which extends in the second direction and is arranged between and connected to two first connection segments, wherein in each set of at least one of the sets of data connection lines, a $i^{th}$ second connection segment has a length of $L_i$, a $j^{th}$ second connection segment has a length of $L_j$, and $L_i > L_j$, and wherein a second auxiliary segment connected to the $i^{th}$ second connection segment has a length of $D_i$, a second auxiliary segment connected to the $j^{th}$ second connection segment has a length of $D_j$, and $D_i < D_j$.

20. The display panel according to claim 1, wherein the functional device area comprises at least two transparent areas arranged in the first direction, a first winding area and a second winding area are arranged between two adjacent transparent areas, the first winding area is arranged around one of the two transparent areas, and the second winding area is arranged around the other of the two transparent areas, and wherein n1 data connection lines are arranged in the first winding area, n2 data connection lines are arranged in the second winding area, and n1 and n2 are integers greater than or equal to 1.

21. The display panel of claim 20, wherein n1=n2.

22. The display panel according to claim 20, wherein a wiring area is arranged between the first winding area and the second winding area, and the data lines comprises a second-type data line which passes through the wiring area.

23. The display panel according to claim 22, wherein each driving circuit of the display panel is arranged outside the wiring area.

24. The display panel according to claim 22, wherein a dummy pixel is arranged in the wiring area.

25. The display panel according to claim 1, wherein the functional device area comprises a first transparent area and a second transparent area which are arranged in the first direction, and in the first direction, the first transparent area has a width larger than a width of the second transparent area, and a number of data connection lines corresponding to the first transparent area is greater than a number of data connection lines corresponding to the second transparent area.

26. The display panel according to claim 1, wherein first fan-out lines and second fan-out lines are arranged between a step area of the display panel and the display area, and at least one of the data lines is connected to a first fan-out line through an auxiliary connection line arranged in the display area, and at least another one of the data lines is connected to a second fan-out line, and wherein an orthographic projection of least one of the first fan-out lines on a light-emitting surface of the display panel intersects with an orthographic projection of at least one of the second fan-out lines on the light-emitting surface of the display panel.

27. The display panel according to claim 1, wherein the display panel further comprises:

auxiliary connection lines arranged in the display area, and at least one of the data lines being connected to a step area of the display panel through an auxiliary connection line, wherein each auxiliary connection line comprises a first auxiliary segment extending in the first direction and a second auxiliary segment extending in the second direction, and wherein the second auxiliary segments and the data lines are alternately arranged in the first direction.

28. The display panel according to claim 1, wherein the display panel further comprises:
   signal lines extending in the first direction and comprising first-type signal lines, wherein each first-type signal line comprises a first signal segment and a second signal segment divided by the functional device area; and
   signal connection lines, wherein each signal connection line is arranged between and connected to a first signal segment and a corresponding second signal segment, and at least one of the signal connection line is arranged in the display area.

29. The display panel according to claim 28, wherein the signal lines comprise at least one of a scan line, a light emission control line, and initialization signal line.

30. A display apparatus, comprising a display panel, wherein the display panel comprises:
   a functional device area;
   a display area surrounding the functional device area;
   a plurality of data lines arranged in a first direction and extending in a second direction, wherein the first direction and the second direction intersect with each other, the data lines comprise first-type data lines, and each first-type data line is divided into a first data segment and a second data segment by the functional device area; and
   data connection lines, wherein each data connection line is to electrically connect a first data segment and a corresponding second data segment,
   wherein at least one of the data connection lines is arranged in the display area;
   wherein the functional device area comprises at least two transparent areas arranged in the first direction, the data connection lines comprise at least two sets of data connection lines which have a one-to-one correspondence with the at least two transparent areas, and each data connection line of each set of data connection lines is to connect a first data segment and a corresponding second data segment which are divided by a corresponding transparent area,
   wherein each data connection line comprises first connection segments extending in the first direction and a second connection segment which extends in the second direction and is arranged between and connected to two first connection segments, and
   wherein in each set of at least one of the sets of data connection lines, a plurality of second connection segments are arranged in the first direction, a $i^{th}$ second connection segment is farther away from a transparent area corresponding to the set of data connection lines than a $j^{th}$ second connection segment, the $i^{th}$ second connection segment has a length of $L_i$, the $j^{th}$ second connection segment has a length of $L_j$, and $L_i > L_j$.

* * * * *